(12) United States Patent
Jose et al.

(10) Patent No.: US 10,260,890 B2
(45) Date of Patent: Apr. 16, 2019

(54) AISLE-BASED ROADMAP GENERATION

(71) Applicant: X Development LLC, Mountain View, CA (US)

(72) Inventors: Alex Jose, Mountain View, CA (US); Daniel Shaffer, Mountain View, CA (US)

(73) Assignee: X Development LLC, Mountain View, CA (US)

( * ) Notice: Subject to any disclaimer, the term of this patent is extended or adjusted under 35 U.S.C. 154(b) by 0 days.

(21) Appl. No.: 15/494,316

(22) Filed: Apr. 21, 2017

(65) Prior Publication Data

US 2018/0306591 A1 Oct. 25, 2018

(51) Int. Cl.
| | |
|---|---|
| *G01C 21/32* | (2006.01) |
| *G06T 11/20* | (2006.01) |
| *G06K 9/00* | (2006.01) |
| *G06F 17/50* | (2006.01) |
| *G06Q 10/08* | (2012.01) |

(52) U.S. Cl.
CPC ............ *G01C 21/32* (2013.01); *G06F 17/50* (2013.01); *G06K 9/00798* (2013.01); *G06Q 10/08* (2013.01); *G06T 11/206* (2013.01); *G06K 9/00805* (2013.01)

(58) Field of Classification Search
CPC combination set(s) only.
See application file for complete search history.

(56) References Cited

U.S. PATENT DOCUMENTS

| | | | |
|---|---|---|---|
| 5,109,340 A | | 4/1992 | Kanayama |
| 5,111,401 A | * | 5/1992 | Everett, Jr. .......... G05D 1/0242 180/169 |
| 5,752,207 A | | 5/1998 | Sarangapani |
| 6,134,486 A | | 10/2000 | Kanayama |
| 7,089,162 B2 | | 8/2006 | Nagel |
| 9,221,481 B2 | | 12/2015 | Desbordes et al. |
| 2002/0169546 A1 | | 11/2002 | Nagel |

(Continued)

OTHER PUBLICATIONS

David Gonzalez et al., "Continuous curvature planning with obstacle avoidance capabilities in urban scenarios," 17th International IEEE Conference on Intelligent Transportation Systems (ITSC), Qingdao, 2014, pp. 1430-1435.
International Search Report dated Jun. 5, 2018 issued in connection with International Application No. PCT/US2018/024979, filed on Mar. 28, 2018, 3 pages.
Written Opinion of the International Searching Authority dated Jun. 5, 2018 issued in connection with International Application No. PCT/US2018/024979, filed on Mar. 28, 2018, 8 pages.

(Continued)

*Primary Examiner* — Sultana M Zalalee
(74) *Attorney, Agent, or Firm* — McDonnell Boehnen Hulbert & Berghoff LLP

(57) ABSTRACT

Apparatus and methods related to generating roadmaps are provided. A layout of an environment can be displayed on a display. Input data indicative of a plurality of shapes placed on the layout can be received, where each shape corresponds to an aisle of a plurality of aisles. For each aisle, lanes can be generated based on a width of the aisle, and the lanes extend along the aisle such that a robotic device can traverse each lane. An intersection between a first shape and second shape can be identified, where the first and second shape correspond to a first and second aisle. Responsive to identifying the intersection and based on a swept space of the robotic device, a curve that connects a first lane of the first aisle to a second lane of the second aisle can be generated. Then, a roadmap that comprises the aisles and curve can be generated.

20 Claims, 21 Drawing Sheets

(56) References Cited

U.S. PATENT DOCUMENTS

| | | | |
|---|---|---|---|
| 2007/0297672 A1* | 12/2007 | Eschbach | H04N 1/3871 |
| | | | 382/173 |
| 2009/0063035 A1 | 3/2009 | Mandel et al. | |
| 2013/0000675 A1 | 1/2013 | Hong et al. | |
| 2013/0110472 A1* | 5/2013 | Chan | E01C 1/02 |
| | | | 703/1 |
| 2014/0278052 A1* | 9/2014 | Slavin | G01C 21/3492 |
| | | | 701/400 |
| 2015/0022447 A1 | 1/2015 | Hare et al. | |
| 2016/0091325 A1* | 3/2016 | Takamatsu | B60W 30/12 |
| | | | 701/408 |
| 2016/0171893 A1* | 6/2016 | Chen | G08G 1/167 |
| | | | 701/300 |
| 2016/0349754 A1* | 12/2016 | Mohr | G05D 1/0088 |
| 2017/0199051 A1* | 7/2017 | Kim | G01C 21/3635 |

OTHER PUBLICATIONS

N. W. Garrick, "Geometric Design of Transportation Facilities", Lectures 5-8, Feb. 11, 2002, available via the Internet at www.engr.uconn.edu/~garrick/ce371/l05-08.htm (last visited May 23, 2016).

D. H. Shin et al, "Path Generation for Robot Vehicles Using Composite Clothoid Segments", Dec. 1990, Technical Report No. CMU-RI-TR-90-31, Robotics Institute, Carnegie-Mellon University.

Trimble, Inc., "K Value", Novapoint Wiki, Sep. 8, 2014, available via the Internet at web.archive.org/web/20140908025806/http://wiki.novapoint.com/doku.php/en:np:road:menu:alignment_design:ad_suppinfo:k_value (last visited Oct. 9, 2016).

M. West, "Dynamics—Track Transition Curves", May 22, 2016, available via the Internet at dynref.engr/illinois.edu/avt.html (last visited May 22, 2016).

E. W. Weisstein, "Cornu Spiral", Apr. 9, 2004, available via the Internet at mathworld.wolfram.com/CornuSpiral.html (last visited May 21, 2016).

* cited by examiner

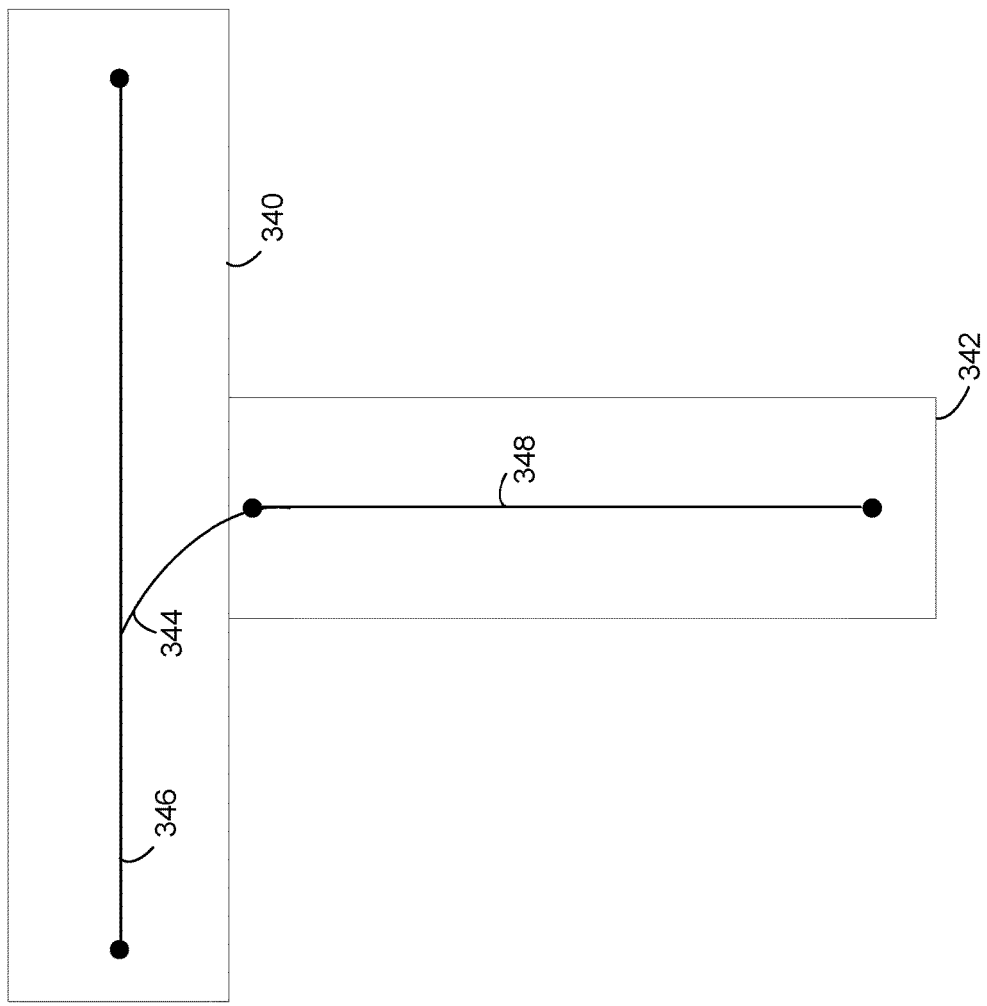

AISLE-BASED ROADMAP GENERATION

BACKGROUND

One or more robots and/or other actors, such as human actors, can move throughout a space, such as the interior of part or all of a building and/or its surrounding outdoor regions, to perform tasks and/or otherwise utilize the space together. One example of a building is a warehouse, which may be used for storage of goods by a variety of different types of commercial entities, including manufacturers, wholesalers, and transport businesses. Example stored goods may include raw materials, parts or components, packing materials, and finished products. In some cases, the warehouse may be equipped with loading docks to allow goods to be loaded onto and unloaded from delivery trucks or other types of vehicles. The warehouse may also use rows of pallet racks to allow for storage of pallets, flat transport structures that contain stacks of boxes or other objects. Additionally, the warehouse may use machines or vehicles for lifting and moving goods or pallets of goods, such as cranes and forklifts. Human operators may be employed in the warehouse to operate machines, vehicles, and other equipment. In some cases, one or more of the machines or vehicles may be robotic devices guided by computer control systems.

Mobile robotic devices can be used in a number of different environments to accomplish a variety of tasks. For example, mobile robotic devices can deliver items, such as parts or completed products, within indoor environments, such as warehouses, hospitals and/or data centers. When mobile robotic devices are deployed, they can use one or more possible paths to and from delivery and/or other locations. These paths can be determined using one or more route planning algorithms.

SUMMARY

To navigate an environment, a mobile robotic device may rely on a roadmap to determine locations of traversable lanes in the environment. As such, a roadmap is designed and provided to the robotic device when the robotic device is to be deployed in an environment. But the process of designing a roadmap is complex and often takes a significant amount of time to complete, which could delay the deployment of the robotic device. In practice, to design a roadmap, a user manually designs each lane, intersection, and curve included in the roadmap. Disclosed herein is a system that simplifies the process of generating a roadmap by providing a graphical interface through which a user can view a layout of an environment and can place shapes on the layout to indicate the location of drivable areas ("aisles") in the environment. The system can then generate the roadmap by (i) placing one or more traversable lanes in each shape, (ii) identifying intersections between shapes, and (iii) generating intersection curves that connect the lanes of the intersecting shapes.

In one aspect, a method is provided. The method includes providing, for display on a display device, a fixed structure layout of an environment, and receiving input data indicative of a plurality of shapes placed on the layout of the environment, where each shape of the plurality corresponds to an aisle of a plurality of aisles. The method also includes generating, for each aisle based on a width of the aisle, a number of lanes along the aisle such that each lane is traversable by a robotic device. The method further includes identifying an intersection between a first shape and a second shape, where the first and second shape correspond to a first and second aisle of the plurality. Additionally, the method includes responsive to identifying the intersection and based on a swept space of the robotic device, generating an intersection curve that connects a first lane of the first aisle to a second lane of the second aisle. Further, the method includes generating a roadmap that comprises the plurality of aisles and the intersection curve, and providing the roadmap for display on the display device.

In another aspect, a computing device is provided. The computing device includes a display device, one or more processors, and a control system. The control system is configured to: provide, for display on a display device, a fixed structure layout of an environment. The control system is also configured to: receive input data indicative of a plurality of shapes placed on the layout of the environment, where each shape corresponds to an aisle of a plurality of aisles. The control system is further configured to: generate, for each aisle based on a width of the aisle, a number of lanes along the aisle such that each lane is traversable by a robotic device, and identify an intersection between a first shape and a second shape, where the first and second shape correspond to a first and second aisle of the plurality. Further, the control system is configured to: responsive to identifying the intersection and based on a swept space of the robotic device, generate an intersection curve that connects a first lane of the first aisle to a second lane of the second aisle. Yet further, the control system is configured to: generate a roadmap that comprises the plurality of aisles and the intersection curve, and provide the roadmap for display on the display device.

In another aspect, a non-transitory computer readable medium is provided. The non-transitory computer readable medium has stored thereon instructions, that when executed by one or more processors of a computing device, cause the computing device to perform functions. The functions include: providing, for display on a display device, a fixed structure layout of an environment. The functions also include receiving input data indicative of a plurality of shapes placed on the layout of the environment, where each shape corresponds to an aisle of a plurality of aisles. Further, the functions include generating, for each aisle based on a width of the aisle, a number of lanes along the aisle such that each lane is traversable by a robotic device. Yet further, the functions include identifying an intersection between a first shape and a second shape, wherein the first and second shape correspond to a first and second aisle of the plurality. Additionally, the functions include generating a roadmap that comprises the plurality of aisles and the intersection curve, and providing the roadmap for display on the display device.

In another aspect, an apparatus is provided. The apparatus includes means for providing, for display on a display device, a fixed structure layout of an environment. The apparatus also includes means for receiving input data indicative of a plurality of shapes placed on the layout of the environment, where each shape of the plurality corresponds to an aisle of a plurality of aisles. Further, the apparatus includes means for generating, for each aisle based on a width of the aisle, a number of lanes along the aisle such that each lane is traversable by a robotic device. Yet further, the apparatus includes means for identifying an intersection between a first shape and a second shape, where the first and second shape correspond to a first and second aisle of the plurality. Additionally, the apparatus includes means for responsive to identifying the intersection and based on a swept space of the robotic device, generating an intersection curve that connects a first lane of the first aisle to a second lane of the second aisle. The apparatus also includes means for generating a roadmap that comprises the plurality of aisles and the intersection curve, and means for providing the roadmap for display on the display device.

The foregoing summary is illustrative only and is not intended to be in any way limiting. In addition to the illustrative aspects, embodiments, and features described above, further aspects, embodiments, and features will become apparent by reference to the figures and the following detailed description and the accompanying drawings.

BRIEF DESCRIPTION OF THE FIGURES

FIGS. 3A, 3B, 3C, 3D, 3E, 3F, and 3G each illustrate an intersection between aisles, in accordance with example embodiments.

DETAILED DESCRIPTION

Overview

Figure 1A:
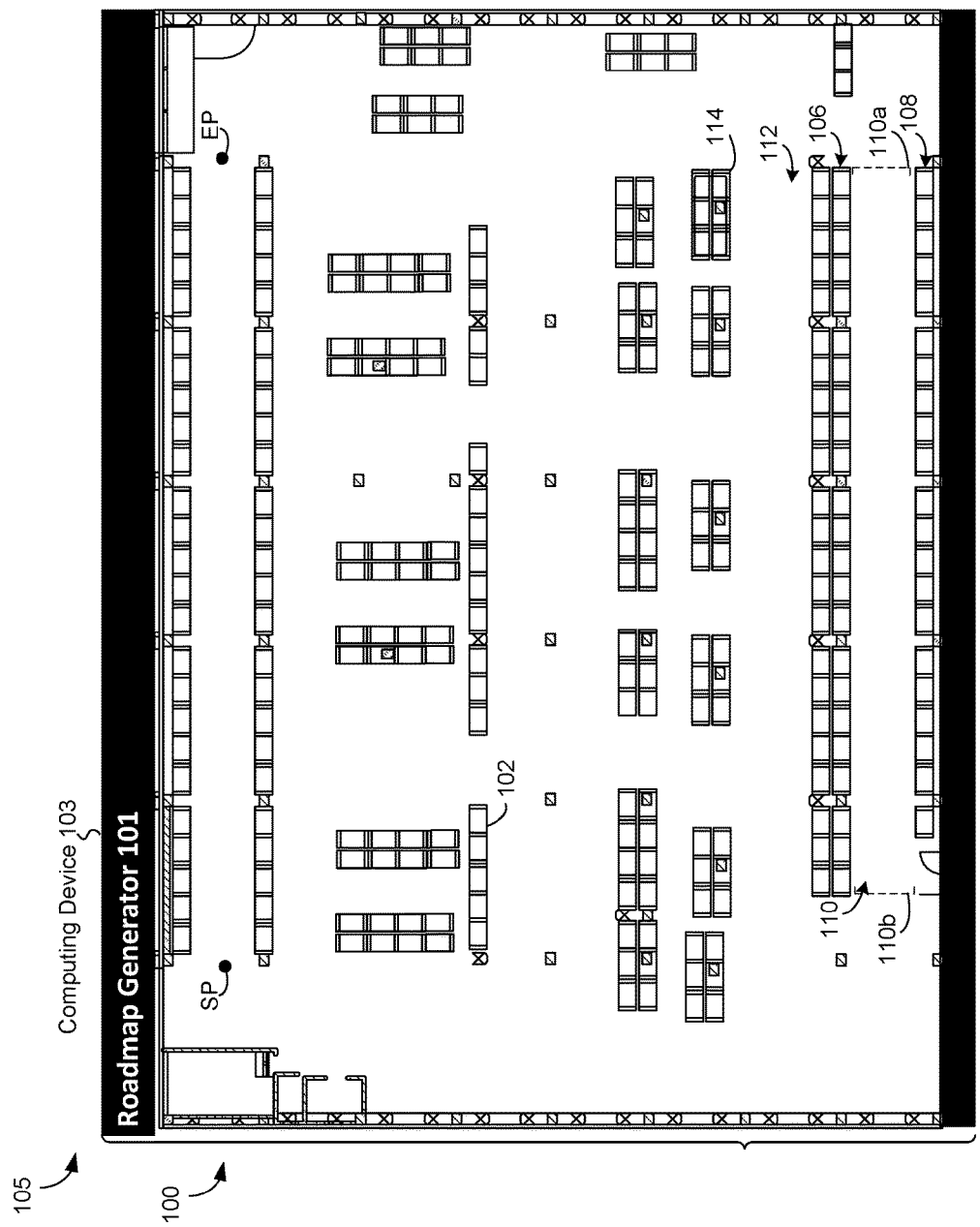
FIGS. 1A, 1B, 1C, and 1D illustrate a layout of an environment, in accordance with example embodiments.

A robotic control system that deploys robotic devices into an environment may be responsible for coordinating motion of the robotic devices in the environment. To coordinate the motion of the robotic devices, the system can generate an asynchronous path for each robotic device to follow while operating in the environment. In practice, the system can generate the asynchronous path using a roadmap of the environment. The roadmap of the environment may include one or more lanes that a robotic device can traverse. In particular, the roadmap can indicate a location and orientation of each lane.

Since the system relies on roadmaps to generate paths for robotic devices, the robotic control system may need a roadmap of an environment in order to deploy robotic devices into the environment. However, the process of generating a roadmap can be complex and time consuming since it involves a designer manually designing the roadmap. Therefore, the amount of time it takes to design a roadmap may affect how quickly robotic devices can be deployed into an environment. Also, the amount of resources that are devoted to designing the roadmap can restrict the number of environments for which a roadmap can be generated, which can restrict the number of environments in which robotic devices can be deployed. Even after a roadmap is generated, changes to the environment (e.g., layout rearrangement) could require a new or updated roadmap.

Disclosed herein are methods and systems that help simplify and expedite a process of generating a roadmap for an environment. In an embodiment, a system provides a graphical interface that displays to a user a representation (e.g. layout or blueprint) of the environment. For example, a layout of the environment may be computer aided design (CAD) that depicts fixed structures such as walls and pallet racks. The user can view the layout and then can provide via the graphical interface an input indicative of drivable "aisles" in the environment. By providing inputs indicative of aisles, the user indicates to the system a location and orientation of drivable areas.

In one implementation, the user can use the graphical interface to overlay rectangles on the layout in order to indicate the location of the aisles. In this implementation, the area that the rectangle covers on the layout corresponds to the area where the aisle is located in the environment. As such, a rectangle placed on the layout corresponds to a drivable aisle in the environment. The system can then determine a number and placement of lanes in each aisle. Then for each aisle, the system can place in the corresponding rectangle the number of lanes for the aisle.

In an embodiment, the lanes are generated as straight lanes that run along a length of the aisle. Thus, the lanes of intersecting aisles can intersect perpendicularly, and therefore, traveling from a lane of one aisle to a lane of another aisle may require taking sharp turns. Such turns can require rapid changes in velocity and/or acceleration, which can be kinematically unfeasible or impractical. To ensure that changes in direction are kinematically feasible or efficient, the system can modify the intersections to include intersection curves. An intersection curve can connect one lane to another lane such that a robotic device can use the intersection curve to travel between the two lanes.

To facilitate modifying intersections to include intersection curves, the system can identify intersections of aisles in the roadmap. The system can then generate intersection curves that connect intersecting rectangles, and can then modify the intersections to include the intersection curves.

Then, the system can generate a roadmap that indicates (i) the location of the aisles in the environment, (ii) the number and placement of lanes in each aisle, and (iii) the intersection curves at the intersections. The system can display the generated roadmap on the graphical interface. Additionally and/or alternatively, the system can send the roadmap to a robotic control system that can use the roadmap to generate routes for robotic devices.

Generating a Roadmap for an Environment

A roadmap is a representation of an environment that includes one or more interconnected lanes that are arranged in drivable areas in the environment. Each drivable area is a region that can accommodate one or more lanes. And each lane is a possible travel path in the environment.

Disclosed herein are methods and systems for generating a roadmap of an environment. The methods disclosed herein of generating a roadmap can be performed using a user interface and/or other software executed on a computing device.

FIGS. 1A-1D illustrate a layout of an environment, in accordance with example embodiments. In particular, FIGS. 1A-1D show scenario 105 where a graphical interface of a computing device, shown in the figures as roadmap generator 101, can be used to provide information that can be used to generate the roadmap of the environment.

FIG. 1A illustrates a graphical interface displaying a layout 100, according to an exemplary embodiment. The layout 100 can be a two-dimensional (2D) or three-dimensional (3D) CAD model of the environment. In the scenario 105, the layout 100 is a 2D representation that depicts structures disposed in the environment, such as pallet racks (e.g., pallet rack 102), walls, and flat transport structures. Such a representation that depicts fixed structures may also be referred to as a "fixed structure layout."

As further illustrated in FIG. 1A, the layout 100 also depicts vacant areas between structures. For instance, a vacant area 110 is located between pallet rows 106 and 108. The vacant area 110 extends between the pallet rows 106 and 108 in width, and between the dashed border lines 110a and 110b in length. Similarly, a vacant area 112 is located between the pallet row 106 and a pallet row 114. These vacant areas can be used to access the various structures. In environments that include robotic devices, some of these vacant areas can be traversed by the robotic devices, and therefore can be referred to as "drivable areas." However, not all vacant areas are drivable. Some vacant area may be too narrow for a robotic device to traverse, and therefore, are not drivable. Other vacant areas, or a portion thereof, may be designated (e.g., by the roadmap generator 101 or a user) as non-drivable. For example, the roadmap generator 101 may designate an area in which construction or repairs are occurring as non-drivable. Additionally, some structures may be bounded in some directions by non-drivable areas. For example, these non-drivable areas that bound some structures may be for safety purposes.

In an embodiment, the user can view the layout 100 on the graphical interface to specify which of the vacant areas is drivable. In particular, the user can designate areas in the environment as "aisles," which are areas or passageways that are drivable. By specifying a location and orientation of aisles, the user indicates the location of drivable areas and a direction of travel in the environment.

Within examples, the user can provide via the graphical interface an input that is indicative of one or more aisles. The graphical interface can include options that allow the user to annotate the layout 100 with the one or more aisles. In particular, the user can define an area in the environment as an aisle by placing a rectangle onto a corresponding area of the layout 100. To generate the rectangle, the user can provide a first input that is indicative of a starting point SP of the rectangle on the layout 100. Then the user can provide a second input indicative of an ending point EP of the rectangle on the layout 100. As illustrated in FIG. 1A, the user has provided an input indicating a location of a SP and EP of a rectangle on the layout 100. Once the SP and EP of a rectangle are specified, the roadmap generator 101 can generate the rectangle that spans on the layout 100 an area between the SP and EP. Within examples, the generated rectangle may have a default size. Alternatively, the user may specify the size of the rectangle.

Figure 1B:
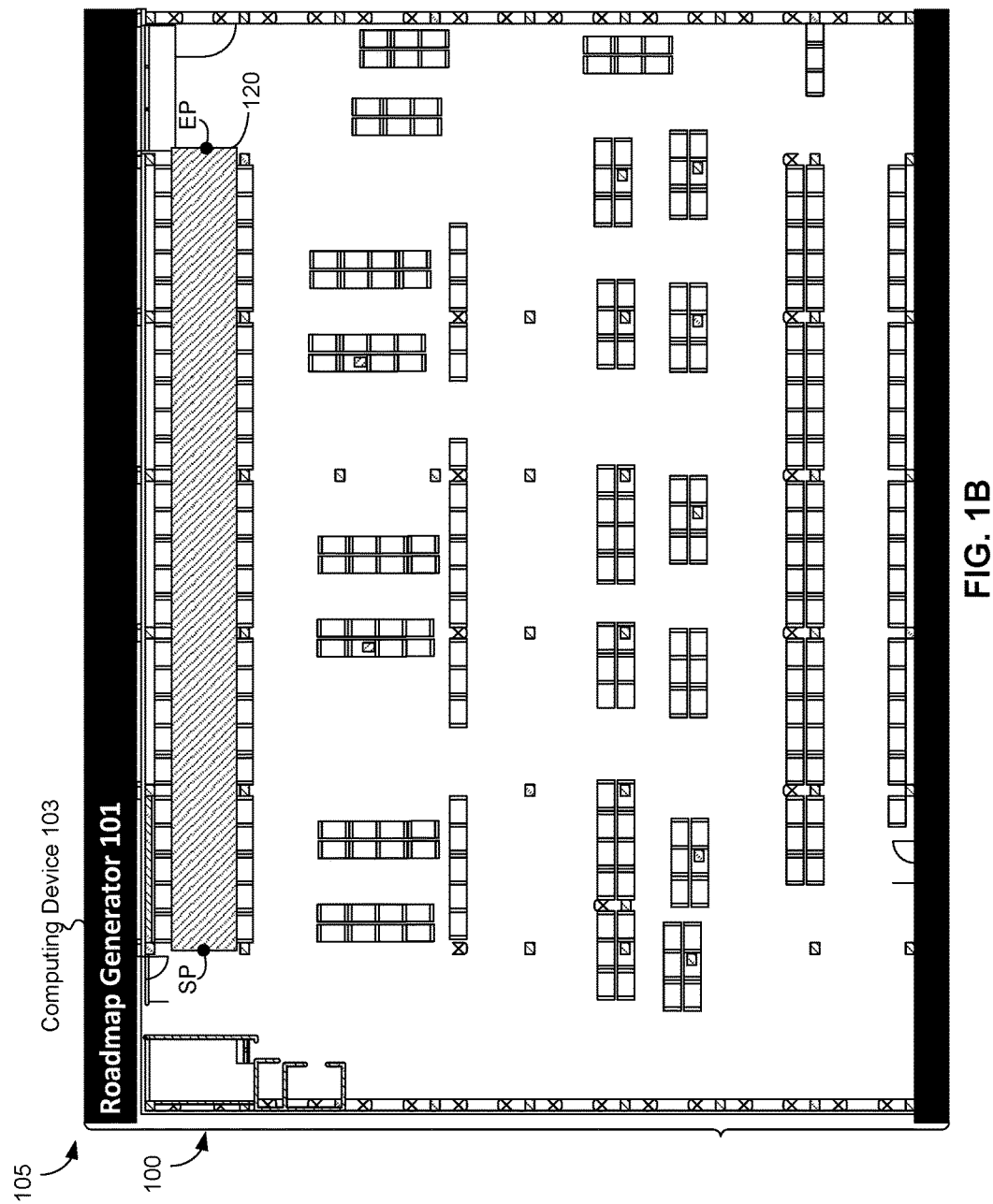

FIG. 1B illustrates a first rectangle 120 covering the area between the SP and EP specified by the user, according to exemplary embodiment. The rectangle that is generated, however, is a temporary rectangle. That is, the rectangle is temporarily displayed on the graphical interface and is not fixed or placed on the layout 100, and the roadmap generator 101 may use a visual indicator (different color, flashing rectangle, etc.) to indicate that the rectangle is temporary. Before placing the rectangle 120 on the layout 100, the roadmap generator 101 may verify whether the area covered by the rectangle 120 corresponds to a drivable aisle in the environment. As explained above, a drivable aisle is an aisle in which a lane can be placed. Thus, one way to determine whether the rectangle 120 corresponds to a drivable aisle is to determine whether a lane can be placed in the area covered by the rectangle 120.

If the roadmap generator 101 determines that the area covered by the rectangle 120 is not drivable, the roadmap generator 101 may responsively output a notification to the user that the rectangle 120 cannot be placed in the area between the SP and EP. Then, the rectangle 120 is no longer displayed on the graphical interface. Alternatively, if the area covered by the rectangle 120 is drivable, the roadmap generator 101 can place the rectangle 120 onto the layout 100. In the scenario 105, the rectangle 120 is placed over a drivable area, and therefore, the rectangle 120 is placed on the layout 100. Within examples, the roadmap generator 101 may use visual indicators (e.g., change a color of the rectangle) to indicate that the rectangles has been fixed to the layout 100.

In some examples, the inputted rectangle may be larger than the drivable area between the SP and EP. For example, the inputted rectangle may be placed on a substantially vacant area, which may be defined as a percentage of the total area of that the rectangle and the value of the percentage may be predefined. That is, the area that the inputted rectangle covers is mostly vacant but also includes structures and/or other non-traversable areas. In such examples, the roadmap generator 101 can resize the rectangle to fit the drivable area between the SP and EP. The roadmap generator 101 can resize the rectangle by decreasing a width and/or length of the rectangle such that the rectangle does not overlap the structures and/or any non-traversable areas around the structures. Additionally and/or alternatively, the roadmap generator 101 can resize the rectangle by increasing a width and/or length of the rectangle such that the rectangle extends past the SP and/or EP to cover any drivable areas that extend from the drivable area between the SP and EP.

Figure 1C:
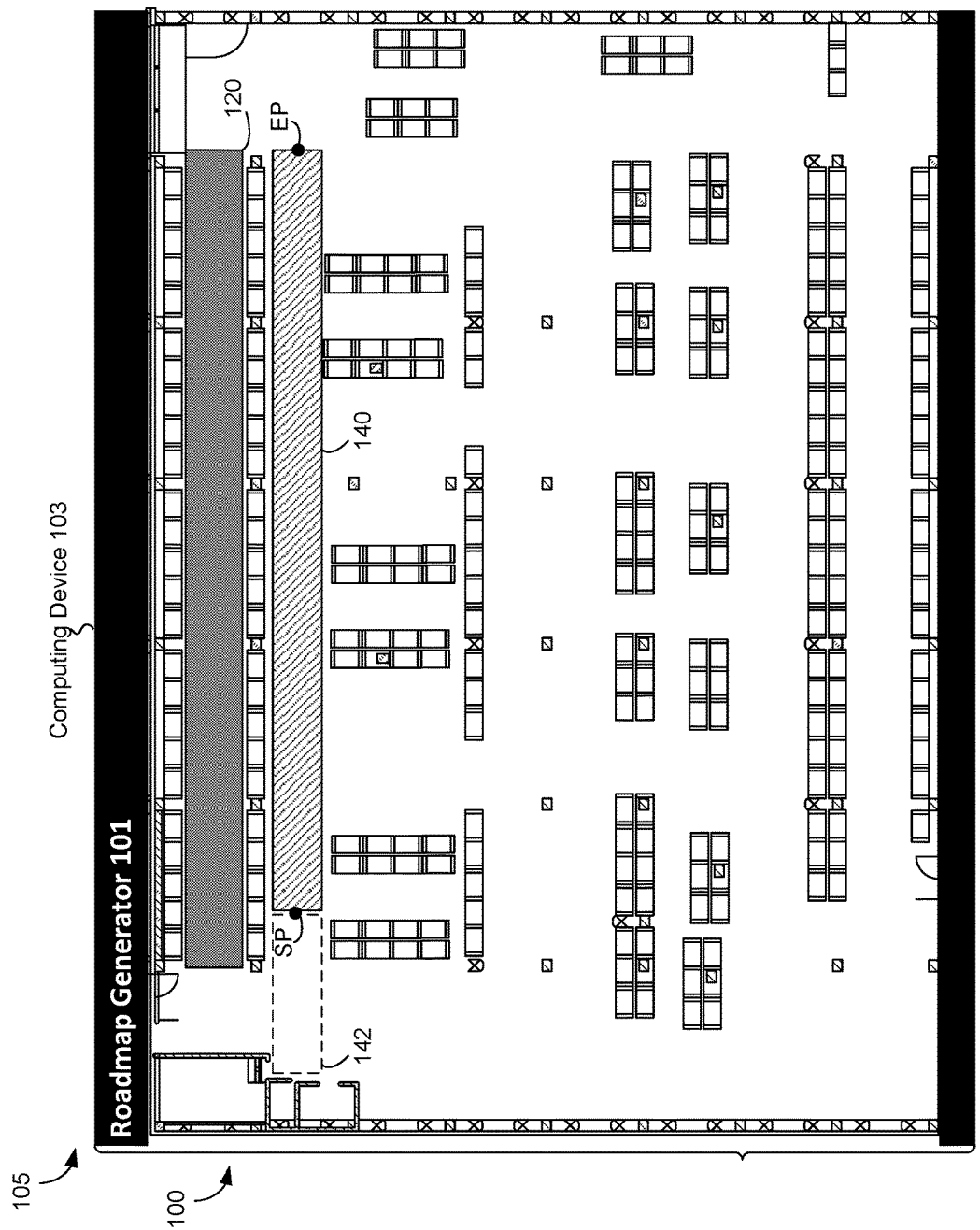

FIG. 1C illustrates a rectangle 140 that covers an area of the layout 100 between a second SP and EP, according to an example embodiment. As also illustrated in FIG. 1C, there is a vacant area 142 that extends from the area that is covered by the rectangle 140. Once the roadmap generator 101 verifies that the area covered by the rectangle 140 is drivable, the roadmap generator 101 can then detect that the rectangle 140 can be resized. In particular, the roadmap generator 101 can detect that a length of the rectangle 140 can be increased such that the rectangle 140 also covers the area 142.

Figure 1D:
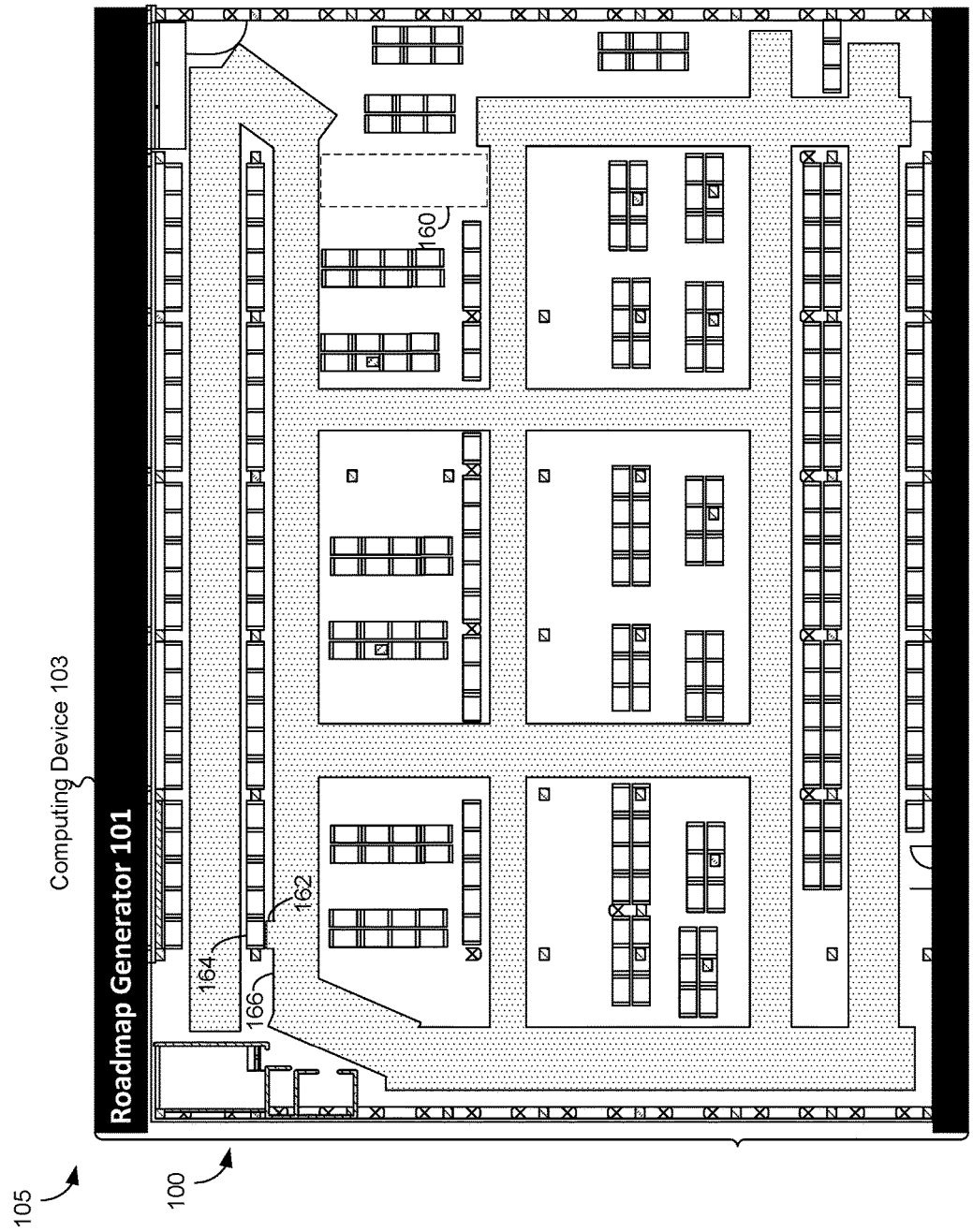

FIG. 1D illustrates drivable areas of the layout 100 covered with rectangles, according to an exemplary embodiment. As illustrated in FIG. 1D, the user has placed rectangles onto areas of the layout 100 to indicate the location and orientation of aisles in the environment. The user can then provide an input indicating that the user has finished placing rectangles on the environment. The roadmap generator 101 can then verify that the vacant areas in the layout 100 have been covered with rectangles. If the roadmap generator 101 detects that some vacant areas have not been covered, the roadmap generator 101 may responsively output a notification to the user indicating that not all of the vacant areas have been covered. The user may then choose to cover any remaining vacant areas with rectangles. Alternatively, the user may choose not to cover the vacant areas with rectangles. Such areas are then considered to be non-drivable areas for the purposes of generating the roadmap.

As illustrated in FIG. 1D, the roadmap generator 101 may detect that a vacant area 160 has not been covered with a rectangle. The roadmap generator 101 may then provide a notification to the user that the vacant area 160 has not been covered with a rectangle. In this example, the user may then proceed to place a rectangle to cover the vacant area 160 or a portion thereof.

In addition to the aisles that are indicated by the rectangles, the roadmap generator 101 can generate "auto-aisles" for the roadmap. The auto-aisles are aisles that extend from structures of a particular type, and connect to a nearest aisle (e.g., aisle entered by a user). For instance, the types of structures for which the roadmap generator 101 generates auto-aisles include fixed structures where retrievable objects are stored (e.g., a pallet rack). For example, in FIG. 1D, an auto-aisle 162 connects between a pallet rack 164 and an aisle 166.

Figure 2A:
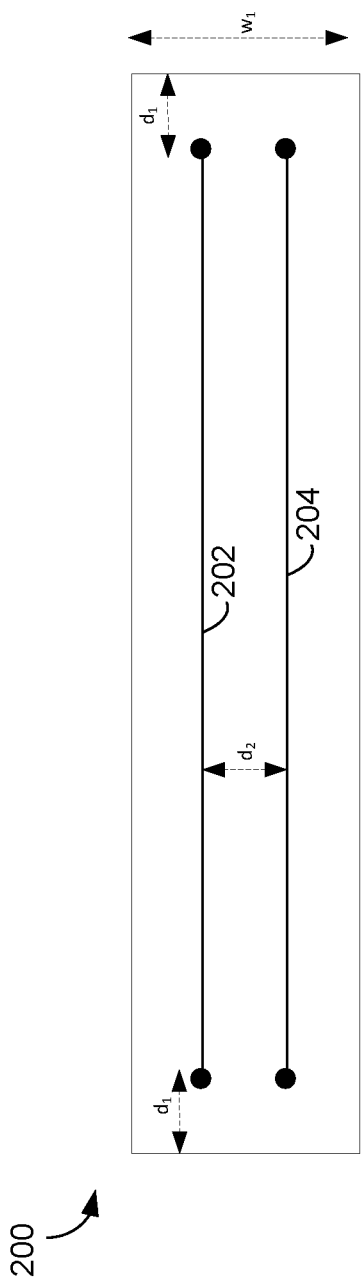
FIG. 2A illustrates an aisle, in accordance with an example embodiment.

FIG. 2A illustrates an aisle 200, according to an exemplary embodiment. After receiving the input indicative of the aisles in the environment, the roadmap generator 101 can calculate a number of lanes that can be placed in each aisle, such as the aisle 200. In an embodiment, the number of lanes that can be placed in the aisle 200 can be calculated based on dimensions of the aisle 200, a swept space of a robotic device that will use traverse the aisle 200, and/or a minimum distance between any two adjacent lanes. The calculation can be simplified by assuming that the one or more lanes that are placed in the aisle 200 are straight lanes that are parallel to the length of the aisle 200. As a result of this assumption, the number of lanes can be calculated based on a width ($w_1$) of the aisle 200, a width of a robotic device, and/or the minimum distance between any two adjacent lanes.

To calculate the number of lanes, the roadmap generator 101 can determine the width of the aisle 200, the width of a robotic device, and the minimum distance between any two adjacent lanes. The width of the aisle 200 may be determined based on a width of the area covered by the aisle 200. The width of the robotic device may be predetermined or determined based on a swept space of the robotic device. The swept space of the robotic device may include an area that is occupied by the body of the robotic device. In some examples, the swept space can also include a buffer area around the area that is occupied by the body of the robotic device. And the minimum distance between any two adjacent lanes can be calculated based on the width of the robotic device. For example, the minimum distance can be calculated such that robotic devices that are each traveling on adjacent lanes do not collide. The roadmap generator 101 can then calculate the number of lanes based on the width of the aisle 200, the width of a robotic device, and the minimum distance between any two adjacent lanes. For example, the number of lanes may be the number of lanes that can be placed within the borders of the aisle 200 while maintaining the minimum distance between any two adjacent lanes.

The number of lanes may then be generated and placed in the aisle 200. As illustrated in FIG. 2A, two lanes 202, 204 are generated and placed in the aisle 200. As further illustrated in FIG. 2A, a length of each lane may span the length of the aisle 200 up to a distance $d_1$ from the sides of the aisle. Ending the lanes at a distance $d_1$ from the sides of the aisle decreases the possibility of a robotic device veering off into a non-drivable area.

In some examples, after determining the number of lanes that can be placed in the aisle 200, the roadmap generator 101 can determine a placement of the lanes in the aisle. In FIG. 2A, the lanes 202, 204 are placed in the aisle such that there is a minimum distance $d_2$ between the two aisles. Further, the lanes 202, 204 are equidistant from the sides of the aisle. Other placements are possible. For example, the distance between the two lanes 202, 204 can be greater than the minimum distance $d_2$. Also, the two lanes 202, 204 may be placed at other distances with respect to the sides of the aisle 200.

Figure 2B:
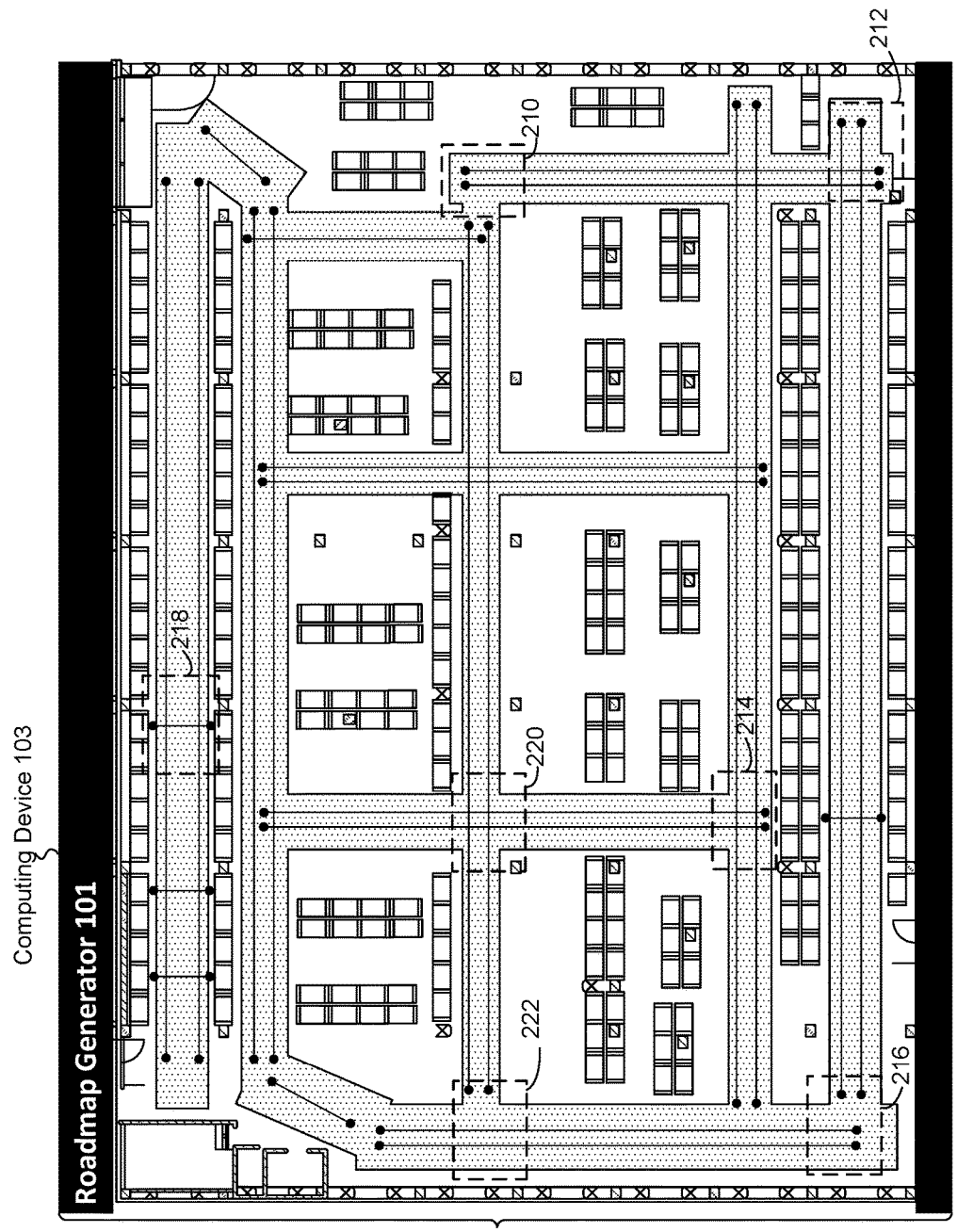
FIG. 2B illustrates a layout of an environment, in accordance with an example embodiment.

FIG. 2B illustrates lanes that are generated in the aisles (represented by rectangles) of the layout 100, according to an exemplary embodiment. As illustrated in FIG. 2B, the different aisles overlap to form intersections. Example intersections include intersections 210, 212, 214, 216, 218, 220, and 222. In an embodiment, the roadmap generator 101 may identify the intersections by identifying overlapping aisles (e.g., based on the placement of the rectangles). And responsive to identifying the intersections, the roadmap generator 101 can generate curves that connect between the lanes of the intersecting aisles based on relative positions of overlapping aisles.

Figure 3A:
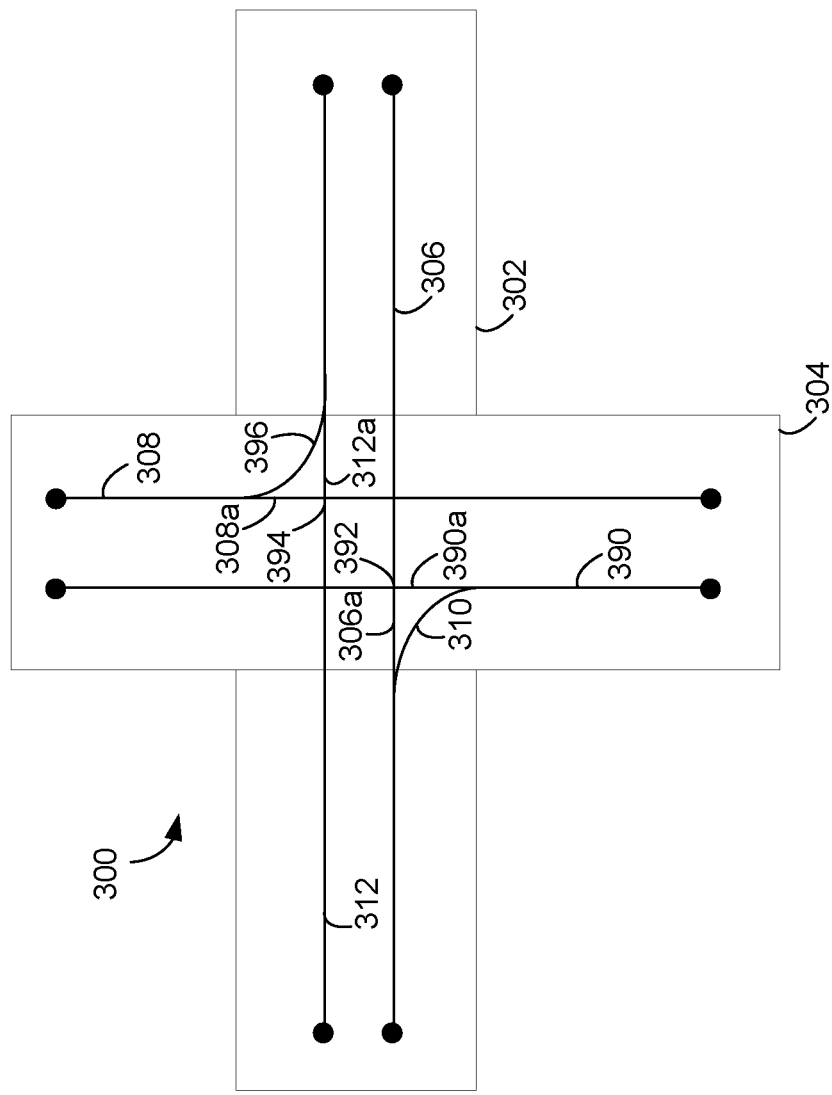

FIG. 3A illustrates an intersection 300 between aisles 302 and 304. As illustrated in FIG. 3A, the aisle 302 includes lanes 306 and 312, and the aisle 304 includes lanes 308 and 390. As illustrated in FIG. 3A, the lanes 306 and 390 intersect at a first intersection point 392, and the lanes 312 and 308 intersect at a second intersection point 394. As further illustrated in FIG. 3A, the aisles 302 and 304 form the intersection 300 by overlapping with one another, and the roadmap generator 101 can therefore detect the intersection 300. The roadmap generator 101 can then generate one or more intersection curves that connect the lanes of the overlapping aisles.

Within examples, the intersection curves are curves that take kinematics of robotic devices into account. Therefore, the curvature of the intersection curves can be calculated using a turning radius of a robotic device, a maximum speed of the robotic device, and a maximum acceleration of a robotic device. Additionally, the curvature of the intersection curves is calculated such that the generated curve is contained within the aisles. By setting the aisles as boundaries for the intersection curve, the roadmap generator 101 can generate an intersection curve that does not overlap any non-traversable areas in the environment. In an example, the intersection curve may be a track transition curve, which is a curve that has a property of varying curvature linearly with arc length.

The roadmap generator 101 can then generate one or more intersection curves and can calculate the curvature of each intersection curves. As illustrated in FIG. 3A, the roadmap generator 101 can generate a first intersection curve 310 that connects a first segment 306a of the lane 306 and a second segment 390a of the lane 390. The roadmap generator 101 can also generate a second intersection curve 396 that connects a first segment 312a of lane 312 and a second segment 308a of lane 308. As illustrated in FIG. 3A, the first intersection curve 310 and the second intersection curve 396 are oriented different from each other.

Figure 3B:
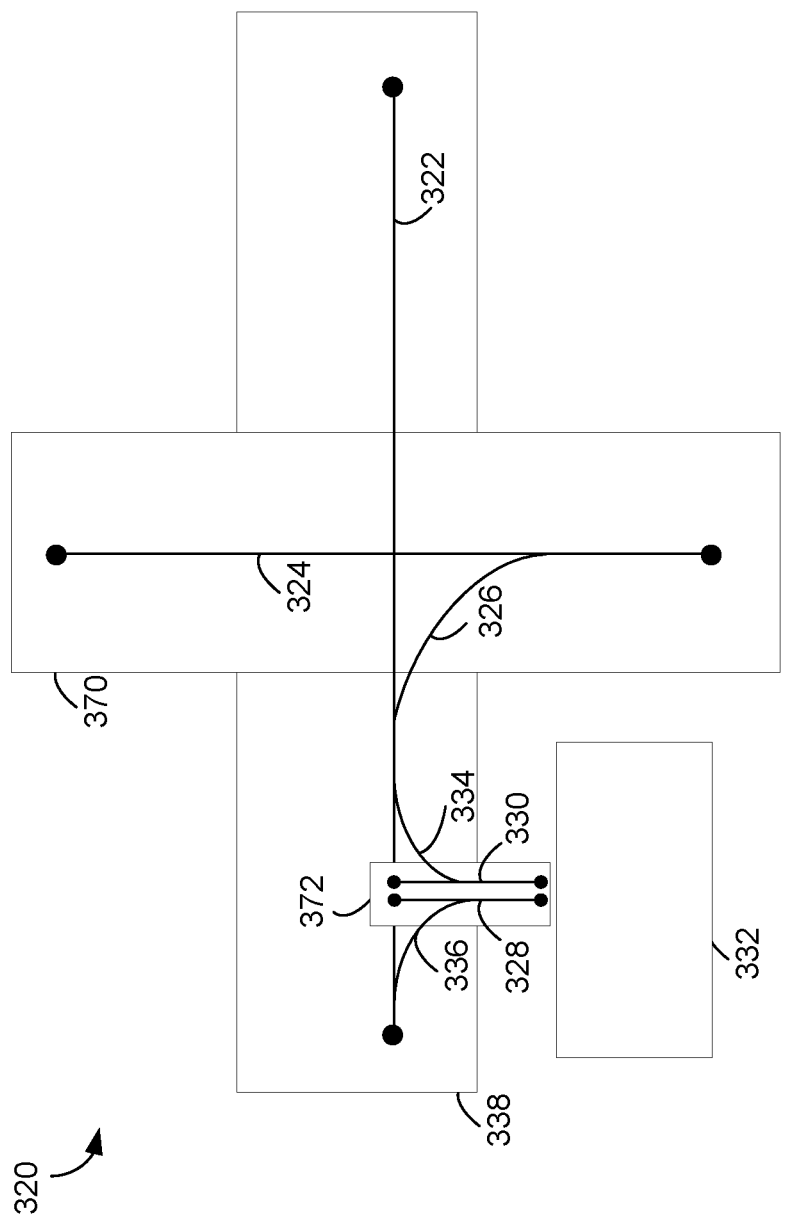

FIG. 3B illustrates another intersection 320, according to an exemplary embodiment. The intersection 320 includes a first intersection between aisles 338 and 370 that include lanes 322, 324 respectively. Accordingly, the roadmap generator 101 can generate an intersection curve 326 that connects the lanes 322, 324. As further illustrated in FIG. 3B, the intersection 320 includes a second intersection between aisles 338 and 372 that include lane 322, and lanes 328, 330 respectively. Aisle 372 is an auto-aisle that connects pallet rack 332 to aisle 338, which is the nearest aisle to aisle 372. As illustrated in FIG. 3B, the roadmap generator 101 can generate intersection curve 334 to connect lane 330 to lane 322, and intersection curve 336 to connect lane 328 to lane 322. As further illustrated in FIG. 3B, the intersection curves 334, 336 are contained within the aisles 338 and 372, which significantly decreases the risk of a robotic device colliding with the pallet rack 332 when traversing either intersection curve.

FIG. 3C illustrates a T-intersection between aisles 340 and 342. As illustrated in FIG. 3C, lanes 346, 348 within the aisles 340, 342 are perpendicular and do not intersect. Nonetheless, the roadmap generator 101 can detect the intersection between aisles even if the generated lanes do not intersect. And responsive to detecting the intersection, the roadmap generator 101 can generate an intersection curve 344 that connects the lanes 346, 348.

Figure 3D:
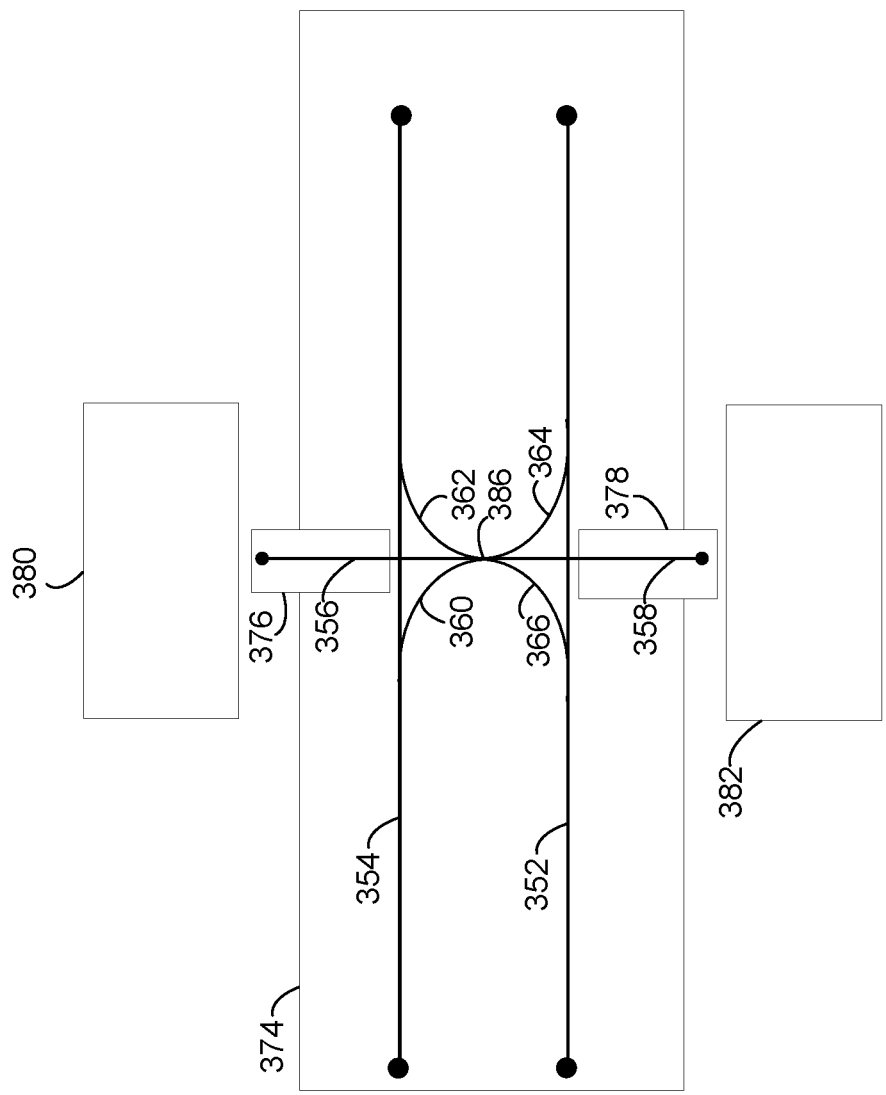

FIG. 3D illustrates an intersection between an aisle 374 and two auto-aisles 376, 378. As illustrated in FIG. 3D, the two auto-aisles 376 and 378 lead to structures 380 and 382 respectively. Further, the two auto-aisles 376 and 378 include lanes 356 and 358 respectively, and the aisle 374 includes lanes 352, 354. As further illustrated in FIG. 3D, the roadmap generator 101 can generate a junction that allows a robotic device that is traveling on one lane to reach any of the other lanes. In particular, the roadmap generator 101 generates intersection curves 360, 362, 364, 366. The roadmap generator 101 further generates a lane 384 that connects the lanes 356 and 358. The lane 384 further forms an intersection point 386 between the intersection curves 360, 362, 364, 366. Accordingly, a robotic device traversing one of the curves can reach any one of the other curves via the intersection point 386.

The intersections that are depicted in FIGS. 3A-3D are only example intersections of the different types of intersections that can be located in an environment. Other intersection types may include intersections between more than two aisles. Further, other intersection types include intersections between aisles that each include more than two lanes.

In an embodiment, the roadmap generator 101 can use intersection template curves to generate intersection curves for an intersection. Although different environments are likely to have different aisle arrangements, the intersections between aisles are often similar. So rather than calculating the curvature for each intersection curve and determining a placement of the curves for similar intersections, the roadmap generator 101 can use a template intersection for similar intersections.

Within examples, the roadmap generator 101 can classify intersections between aisles based on (i) a number of intersecting aisles in the intersection, and (ii) a number of lanes that are located in each aisle. By way of example, a category of intersections may include intersections of two aisles, where each aisle includes three aisles. Further, intersections under the same category may require a same number of intersection curves and a similar placement of the intersection curves. Therefore, each category of intersections may have a template intersection that includes a number of intersection curves and information about the placement of the intersection curves.

Figure 3E:
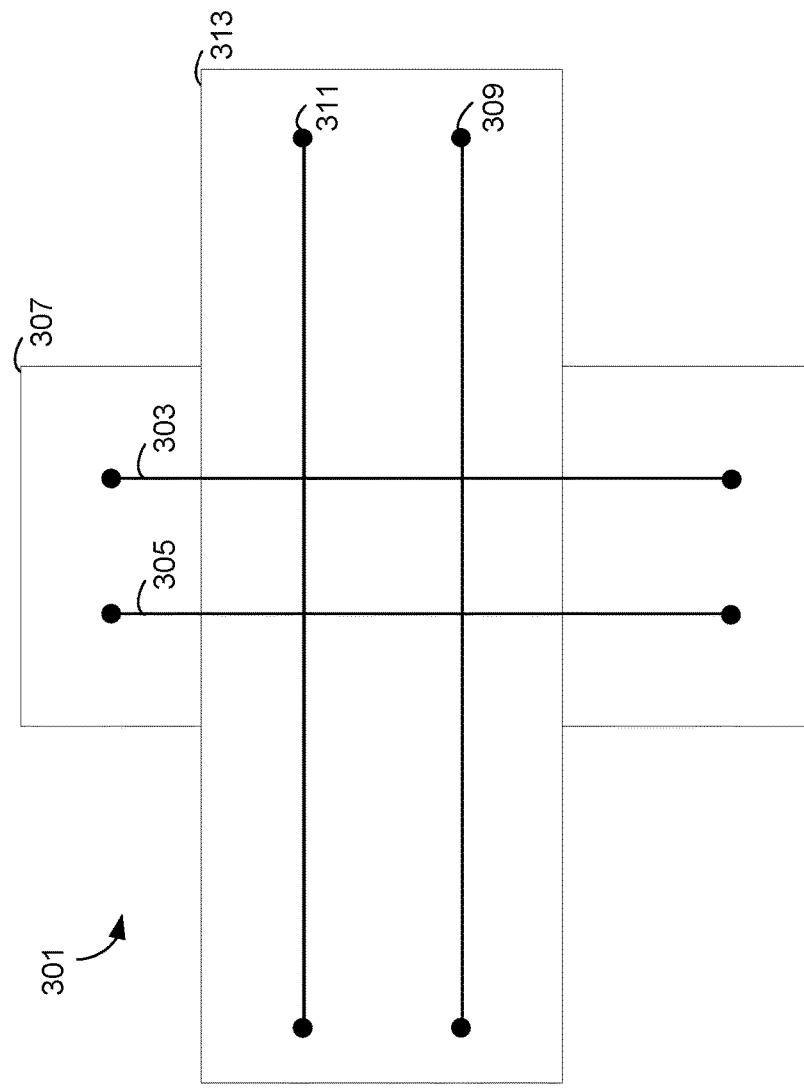

FIG. 3E illustrates an intersection 301 between two aisles 307, 313. As illustrated in FIG. 3E, aisle 307 includes two lanes 303, 305, and aisle 313 includes two lanes 309, 311. The roadmap generator 101 can identify the category to which the intersection 301 belongs by identifying the number of aisles in the intersection 301 and the number of the lanes that are included in each aisle. Accordingly, the roadmap generator 101 can identify that the category of the intersection 301 is "two aisles & two lanes in each aisle."

The roadmap generator 101 can then retrieve an intersection template that is associated with that category "two aisles & two lanes in each aisle." In an example, the intersection template can include eight intersection curves that can be placed in the intersection 301.

Figure 3F:
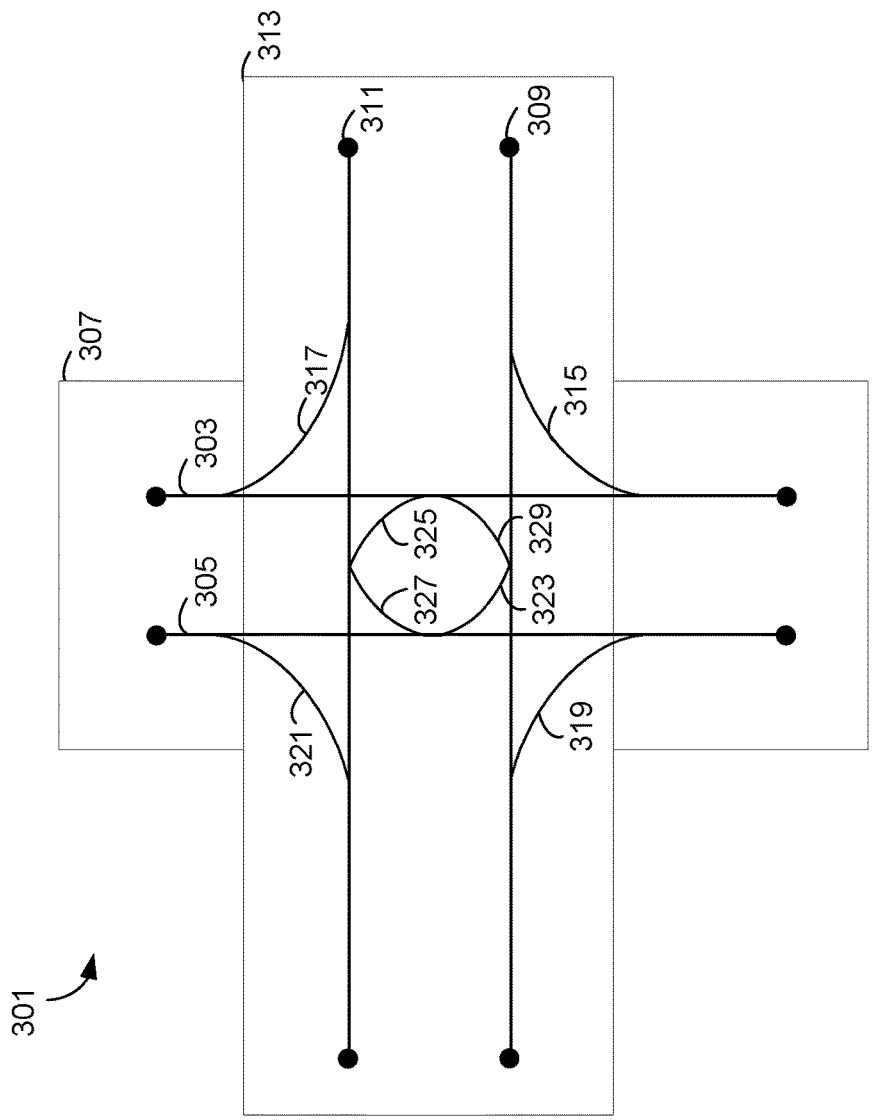

FIG. 3F illustrates the intersection 301 modified with the template intersection, according to an exemplary embodiment. As illustrated in FIG. 3F, the template intersection includes eight intersection curves 315, 317, 319, 321, 323, 325, 327, and 329. The template intersection may have specified the placement of the intersection curves as well. As an example, the template intersection could specify that four intersection curves connect outer portions of any two intersecting lanes. These four intersection curves are depicted in FIG. 3F as intersection curves 315, 317, 319, and 321. Additionally, the template could specify that another four intersection curves connect middle portions of any two intersecting lanes. These intersection curves are depicted in FIG. 3F as intersection curves 323, 325, 327, and 329. The intersection curves 323, 325, 327, and 329 form a roundabout or traffic circle like junction that interconnects the four lanes 303, 305, 309, 311.

Figure 3G:
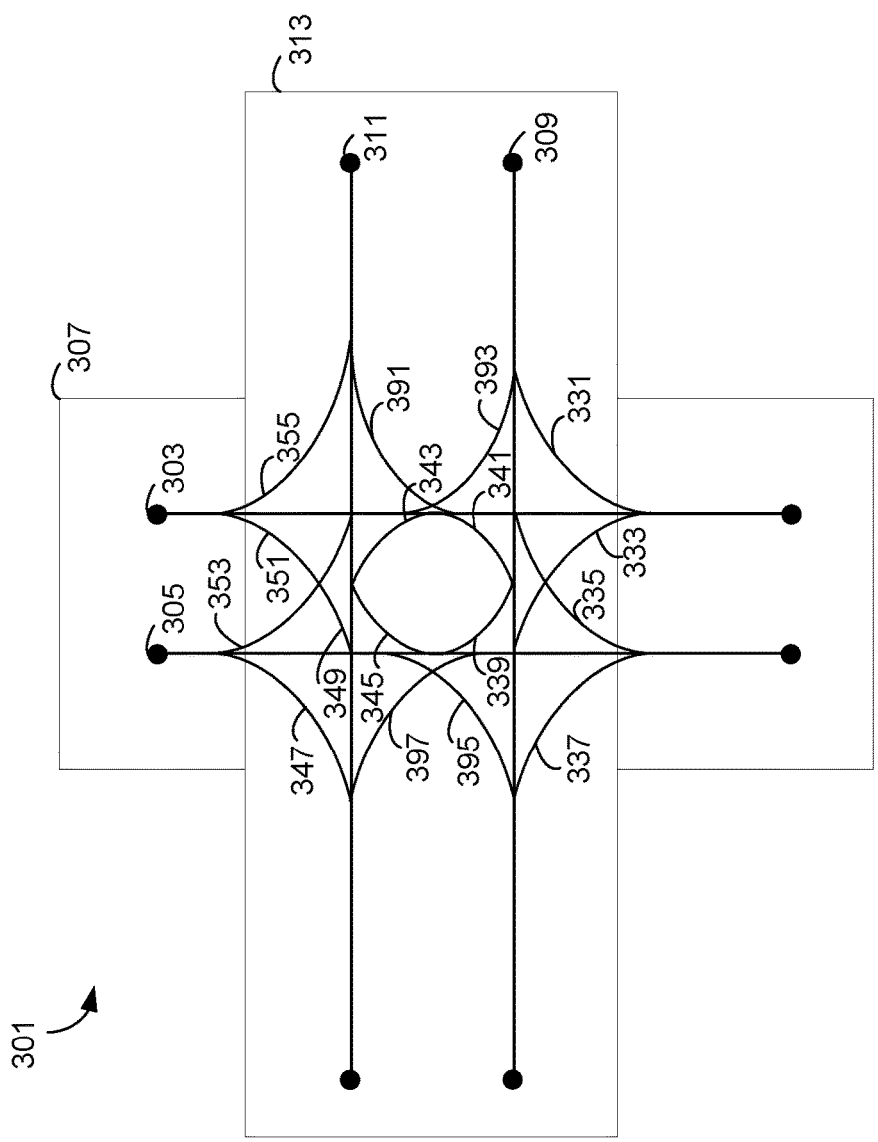

FIG. 3G illustrates an intersection 301 that has been modified with a template intersection, according to an exemplary embodiment. As described above, the intersection 301 is in the category "two aisles & two lanes in each aisle." Accordingly, the roadmap generator 101 can apply to the intersection 301 a template that is associated with that category. As illustrated in FIG. 3G, the template includes intersection curves 331, 333, 335, 337, 339, 341, 343, 345, 347, 349, 351, 353, 355, 391, 393, 395, and 397.

Within examples, the template that is selected for a particular intersection can depend on whether the lanes are unidirectional or bidirectional. For example, if the lanes 301, 303, 309, 311 are bidirectional then the intersection 301 is modified with the intersection template described in FIG. 3F. On the other hand, if the lanes 301, 303, 309, 311 are bidirectional then the intersection 301 is modified with the intersection template described in FIG. 3G.

Furthermore, the roadmap generator 101 may also adjust one or more intersection curves of a template before applying the template to an intersection. For example, the roadmap generator 101 may detect that an intersection curve may overlap with an area outside the aisles of the intersection. And since an intersection curve overlapping with an area outside the aisles may indicate that the curve is overlapping a non-traversable area, the roadmap generator 101 may responsively adjust the curvature of the intersection curve. One way the roadmap generator 101 can adjust the curvature of an intersection curve is determining a swept space of a robotic device and any non-traversable areas near the intersection curve. The roadmap generator 101 can then adjust the curvature of the intersection curve such that the robotic device does not collide with or enter the non-traversable areas near the intersection curve.

Once the roadmap generator 101 has generated curves for the intersections in the roadmap, the roadmap generator 101 may then generate the roadmap of the environment. In particular, the roadmap may include the one or more lanes of each aisle. Further, the roadmap may include the intersection curves that are generated for each intersection. Once the roadmap is generated, the roadmap may be displayed on the graphical interface.

Figure 4:
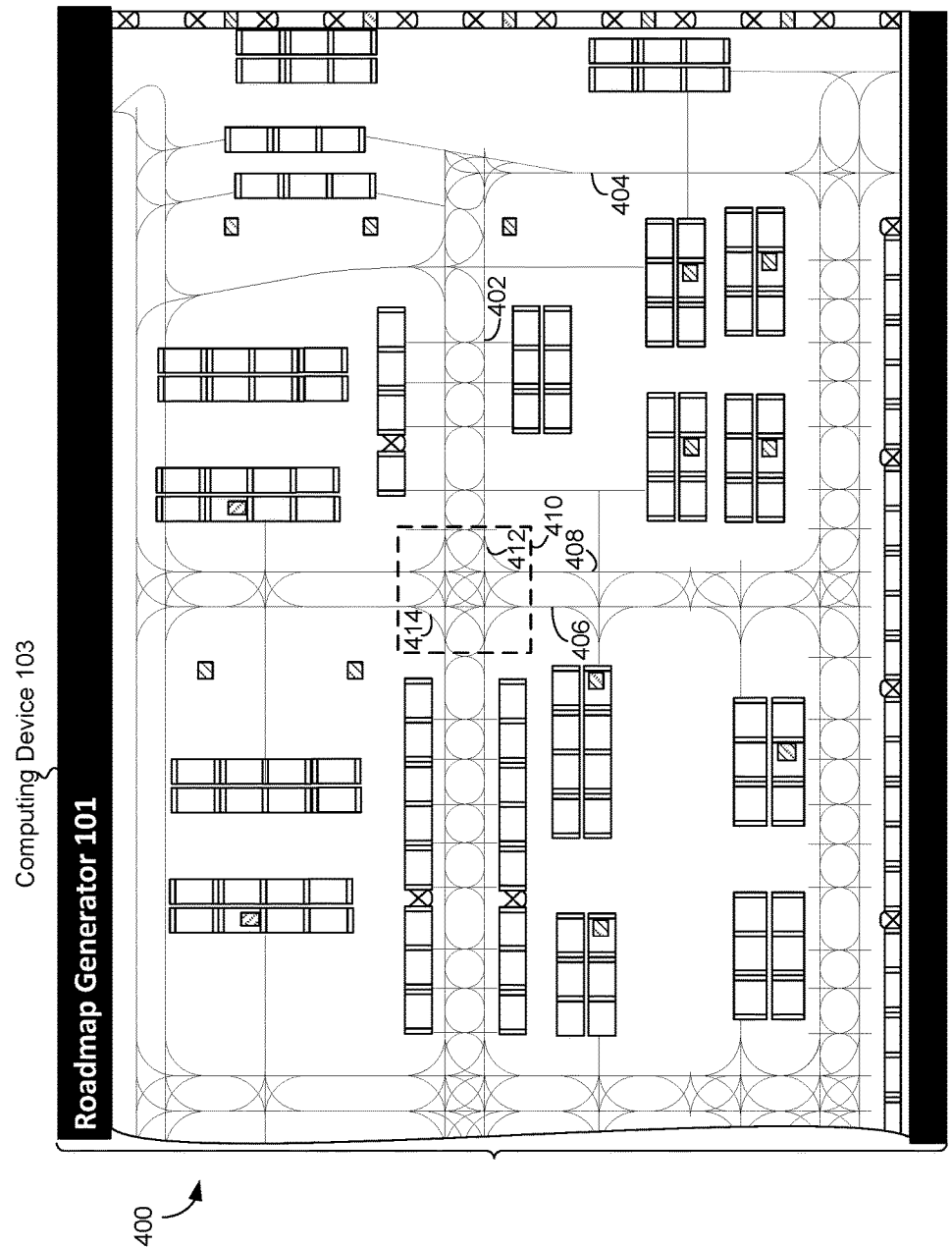
FIG. 4 illustrates a roadmap of an environment, in accordance with an example embodiment.

FIG. 4 illustrates a graphical interface displaying a generated roadmap 400, according to an exemplary embodiment. As illustrated in FIG. 4, the roadmap 400 includes interconnected lanes in the environment, where each lane is represented as a line and indicates a possible travel path in the environment. Example lanes include lanes 402, 404, 406, 408, among other lanes. Intersection 410 is an example intersection that includes lanes 406, 408 and intersection curves 412, 414. As also illustrated in FIG. 4, the roadmap 400 also includes structures such as flat transport structures. Some roadmaps are generated without the structures.

Additionally, the roadmap 400 can be used by a robotic control system that is responsible for deploying and controlling motion of robotic devices in the environment. In particular, the robotic control system can generate paths for the robotic devices along the lanes of the roadmap 400. Therefore, the methods and systems disclosed herein can generate, based on a user input of rectangles to outline drivable areas in an environment, a complex roadmap (e.g., roadmap 400) that includes interconnected lanes that provide robotic devices with paths and directions of travel in the environment.

In an embodiment, the roadmap generator 101 can also update the roadmap 400 after it has been generated. For example, the roadmap generator 101 may receive an input indicating that changes were or will be made to an environment of which the roadmap 400 provides a map. In an instance, the input may be a new CAD drawing of the environment, which may be indicative of a new arrangement of structures in the environment. In another instance, the input may be a user input indicating that is indicative of the user making changes to the layout of the environment (e.g., by adding or removing aisles). Other inputs are possible.

Within examples, the roadmap generator 101, responsive to receiving the input indicating changes to the environment, can automatically update the roadmap 400 to account for any changes. For example, if the changes introduce a new structure to the environment, the roadmap generator 101 can remove any aisles and/or lanes that overlap with the new structure. The roadmap generator 101 can then generate an updated roadmap based on a layout of the environment that does not include the removed aisles. In another example, if the changes remove a structure from the environment, the roadmap generator 101 can place an aisle in place of the removed structure. Then, the roadmap generator 101 can generate one or more lanes in the added aisle. Alternatively, the roadmap generator 101 may send a notification to the user requesting from the user to provide an input indicative of an aisle in the area from which the structure was removed.

Figure 5:
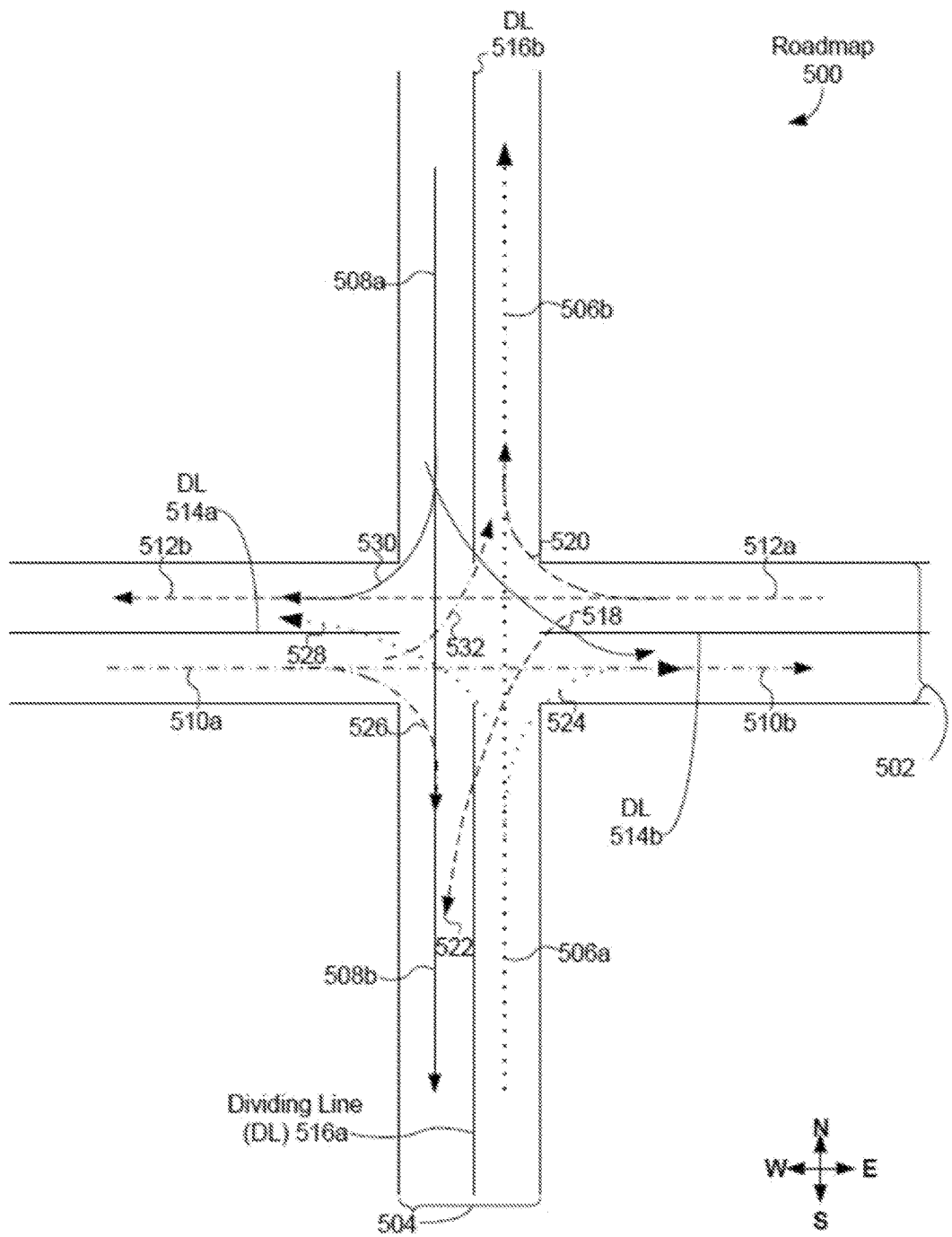
FIG. 5 illustrates an intersection of a roadmap, in accordance with an example embodiment.

FIG. 5 illustrates a portion 500 of a roadmap, in accordance with an example embodiment. The portion 500 of the roadmap includes an intersection of an aisle 502 and an aisle 504, and each aisle includes two lanes. As illustrated in FIG. 5, the aisle 502 includes lanes 510a, 510b, 512a and 512b, which are separated by dividing lines 514a, 514b. Also, the aisle 504 includes lanes 506a, 506b, 508a, and 508b, which are separated by dividing lines 516a, 516b. In each aisle, the direction of travel along the lanes is opposite to one another as indicated by arrow at the end of each lane. Furthermore, the roadmap 500 also illustrates intersection curves that connect the lanes. As illustrated in FIG. 5, curve 518 connects lane segment 508a and lane segment 510b, curve 520 connects lane 512a and lane segment 506b, curve 522 connects lane segment 512a and lane segment 508b, curve 524 connects lane segment 506a and lane segment 510b, curve 526 connects lane segment 510a and lane segment 508b, curve 528 connects lane segment 506a and lane segment 512b, curve 530 connects lane segment 508a and lane segment 512b, and curve 532 connects lane segment 510a and lane segment 506b.

Although FIGS. 1A-1D, 2A-2B, and 3A-3G depict examples where rectangles are placed on the layout of an environment, these examples should not be limiting. For example, other shapes can be placed on the layout of the environment. In an example, the shape can be any shape with three or more sides (e.g., quadrilateral). In another example, the shape with two parallel sides (e.g., a parallelogram). Other shapes are also possible.

System Design for Robotic Devices

Figure 6:
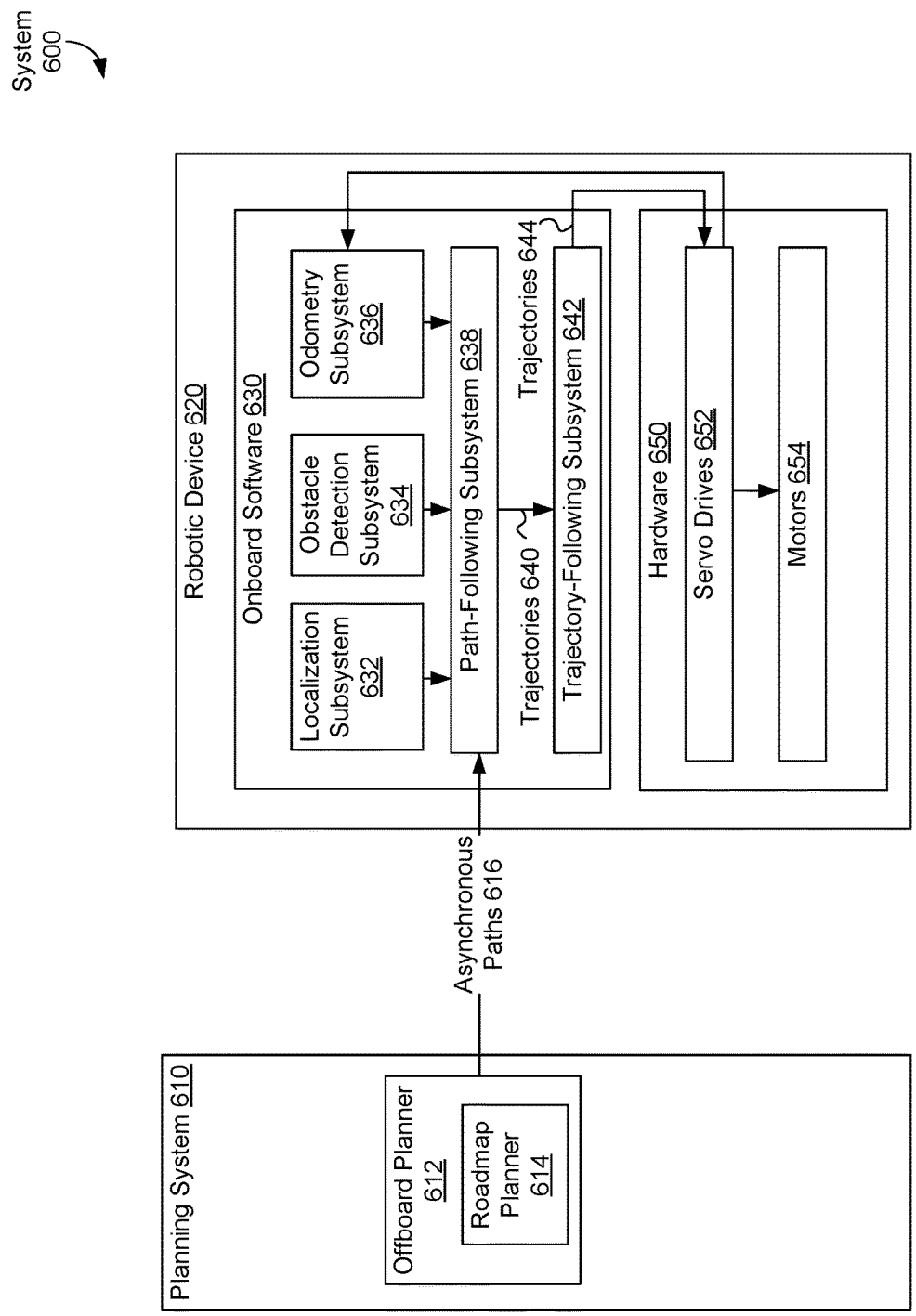
FIG. 6 is a block diagram of a system, in accordance with an example embodiment.

FIG. 6 is a block diagram of system 600, in accordance with an example embodiment. System 600 includes planning system 610 and robotic device 620. Planning system 610 can include offboard planner 612 that can coordinate motion of one or more robotic devices operating in an environment. Offboard planner 612 can include roadmap planner 614. Offboard planner 612 and/or roadmap planner 614 can generate one or more asynchronous paths 616 for a robotic device, such as robotic device 620, to follow while operating in an environment.

A roadmap graph, prototype graph, or other roadmap representing an environment, such as prototype graph 800 discussed below in the context of FIG. 8, can be received, determined, or otherwise provided to planning system 610, offboard planner 612 and/or roadmap planner 614. Asynchronous paths 616 can be one or more paths based on the roadmap graph, prototype graph, or other roadmap. For example, if the roadmap graph, prototype graph, or other roadmap has a plurality of edges that connect a plurality of intersections, asynchronous paths 616 can be specified in terms of the plurality of edges and/or the plurality of intersections.

In some examples, offboard planner 612 and/or roadmap planner 614 can include some or all of the herein-described functionality of a multi-agent planner. In these examples, a roadmap graph, prototype graph, or other roadmap can have a plurality of edges and/or a plurality of lanes that connect a plurality of intersections; e.g., offboard planner 612 and/or roadmap planner 614 can act as multi-agent planner utilizing a roadmap 400. In particular of these examples, one or more of asynchronous paths 616 can include one or more lanes, non-lane edges, and/or hyperedges. In more particular of these examples, one or more of asynchronous paths 616 can include a time-ordered sequence of hyperedges for one agent, where the hyperedges in the time-ordered sequence of hyperedges can be considered in order of their completion times.

Robotic device(s) 620 can include onboard software 630 and/or hardware 650. Onboard software 630 can include one or more of: localization subsystem 632, obstacle detection subsystem 634, odometry subsystem 636, path-following subsystem 638, and trajectory-following subsystem 642. Localization subsystem 632 can be used to localize a robotic device, that is, determine a location of the robotic device within an environment. Localization subsystem 632 can generate position estimates of the robotic device and/or other objects that can be used to localize the robotic device, assist the robotic device in following a path, such as asynchronous paths 616, and/or assist the robotic device in following a trajectory, such as trajectories 640. Once the position estimates are generated, localization subsystem 632 can provide the position estimates to path-following subsystem 638.

An asynchronous path, or path for short, can be a time-invariant plan or other information indicating how robotic device 620 can travel from a starting point SP to an ending point EP; i.e., an (asynchronous) path does not take time into account. In contrast, a trajectory can include values of a steering angle and of traction motor velocity that robotic device 620 can follow for a planning time interval.

The planning time interval can be a duration of time used that a robotic device is guided, or planned to follow a path, route, and/or travel. In some embodiments, the planning time interval can be a predetermined amount of time; e.g., five seconds, one second, 0.2 seconds, 0.1 seconds. In particular, a predetermined planning time interval can be determined based on a user input that specifies a value for the planning time interval. In other embodiments, the planning time interval can be determined based on one or more other values; e.g., a stitch time, a time associated with a uniform edge (or path) cost, an estimated time to travel along a trajectory. Other techniques for determining the planning time interval and values for the planning time interval are possible as well.

Then, one or more trajectories can be used to describe how robotic device 620 can travel from starting point SP to an ending point EP in a time-variant manner. In some embodiments, a trajectory can also provide information about values of other variables than a steering angle and a traction motor velocity over the planning time interval, such as, but not limited to, other kinematic variables (e.g., velocity and acceleration) of robotic device 620, and actuator positions of robotic device 620.

As an example, a path to drive a car from a location "home" to a location "work" may include an ordered listing of streets that a control entity, such as a person or control device of an autonomous vehicle, can use to drive the car from home to work. In this example, a trajectory from home to work can involve one or more instructions specifying velocity and/or acceleration that the control entity can use to drive the car from home to work. In some examples, the trajectory can take traffic, obstacles, weather, and other time-sensitive conditions into account; e.g., the trajectory to go from home to work can indicate that the control entity "turn right for 10 seconds at 20 MPH or less", "accelerate to 55 MPH and drive straight for 3 minutes", "slow to 20 MPH within 30 seconds", "turn left for 10 seconds at 20 MPH or less", etc. In some embodiments, the trajectory can be changed along the way; e.g., to account for obstacles, changes in path, etc.

Obstacle detection subsystem 634 can determine whether one or more obstacles are blocking a path and/or a trajectory of robotic device 620. Examples of these obstacles can include, but are not limited to, pallets, objects that may have fallen off a pallet, robotic devices, and human operators working in the environment. If an obstacle is detected, obstacle detection subsystem 634 can provide one or more communications indicating obstacle detection to path-following subsystem 638. The one or more communications indicating obstacle detection can include location information about one or more positions of one or more obstacles detected by obstacle detection subsystem 634 and/or identification information about the one or more obstacles detected by obstacle detection subsystem 634. Odometry subsystem 636 can use data, such as data from servo drives 652, to estimate one or more changes in position of robotic device 620 over time.

Path-following subsystem 638 and/or trajectory-following subsystem 642 can act as a planner aboard robotic device 620. This onboard planner can follow one or more paths, such as asynchronous paths 616, based on position estimates provided by localization subsystem 632.

Path-following subsystem 638 can receive asynchronous paths 616, position estimate inputs from localization subsystem 632, location information about one or more positions of one or more obstacles from obstacle detection subsystem 634, and/or information about one or more changes in position from odometry subsystem 636, and generate one or more trajectories 640 as outputs.

Hardware 650 can include servo drives 652 and/or motors 654. Servo drives 652 can include one or more servo drives. Servo drives 652 can include an electronic amplifier used to power one or more servomechanisms and/or can monitor feedback signals from the servomechanism(s). Servo drives 652 can receive control signals, such as trajectories 644, from onboard software 630, and can provide electric current to the servomechanism(s) to produce motion proportional to the control signals. In some embodiments, servo drives 652 can compare status information received from the servomechanism(s) with an expected status as commanded by trajectories 644. Then, servo drives 652 can adjust a voltage frequency or pulse width of the provided electric current to correct for deviations between received status information and an expected status. In other embodiments, servo drives 652 can provide information, such as the feedback signals and/or location-related information, to onboard software 630.

One or more motors 654 can be part or all of the servomechanism(s) powered by servo drives 652. For example, motors 654 can use the electric current provided by servo drives 652 to generate mechanical force to drive part or all of robotic device 620; e.g., motors 654 can provide force to propel robotic device 620 and/or drive one or more effectors of robotic device 620.

Path planning of robotic devices within an environment, such as an environment that includes indoor settings, such as a warehouse, office building, or home, and/or outdoor settings, such as a park, parking lot, or yard, can be performed with respect to a roadmap graph, which is a connected graph of paths and/or lanes that agents, such as robotic devices (robots), may follow. Using roadmap graphs to plan agent routing within the environment rather than taking a free-space approach can reduce a total planning state space and so making large-scale multi agent coordination tractable. Further, the use of roadmap graphs can enable operators to intuitively control areas in which robotic devices are allowed to navigate. Such path planning can be carried out at least in part by a herein-described multi-agent planner.

Roadmap graph generation can first involve generation of a prototype graph, which indicates the rough position of lanes and directions of travel. In some examples, a prototype graph can be a directed graph that indicates lanes and directions of travel of robotic devices. In other examples, a prototype graph can be generated manually based on a map or drawing of the environment. In further examples, a prototype graph can be a roadmap that has been annotated with one more lanes, such as discussed above in the context of FIG. 4.

Figure 7:
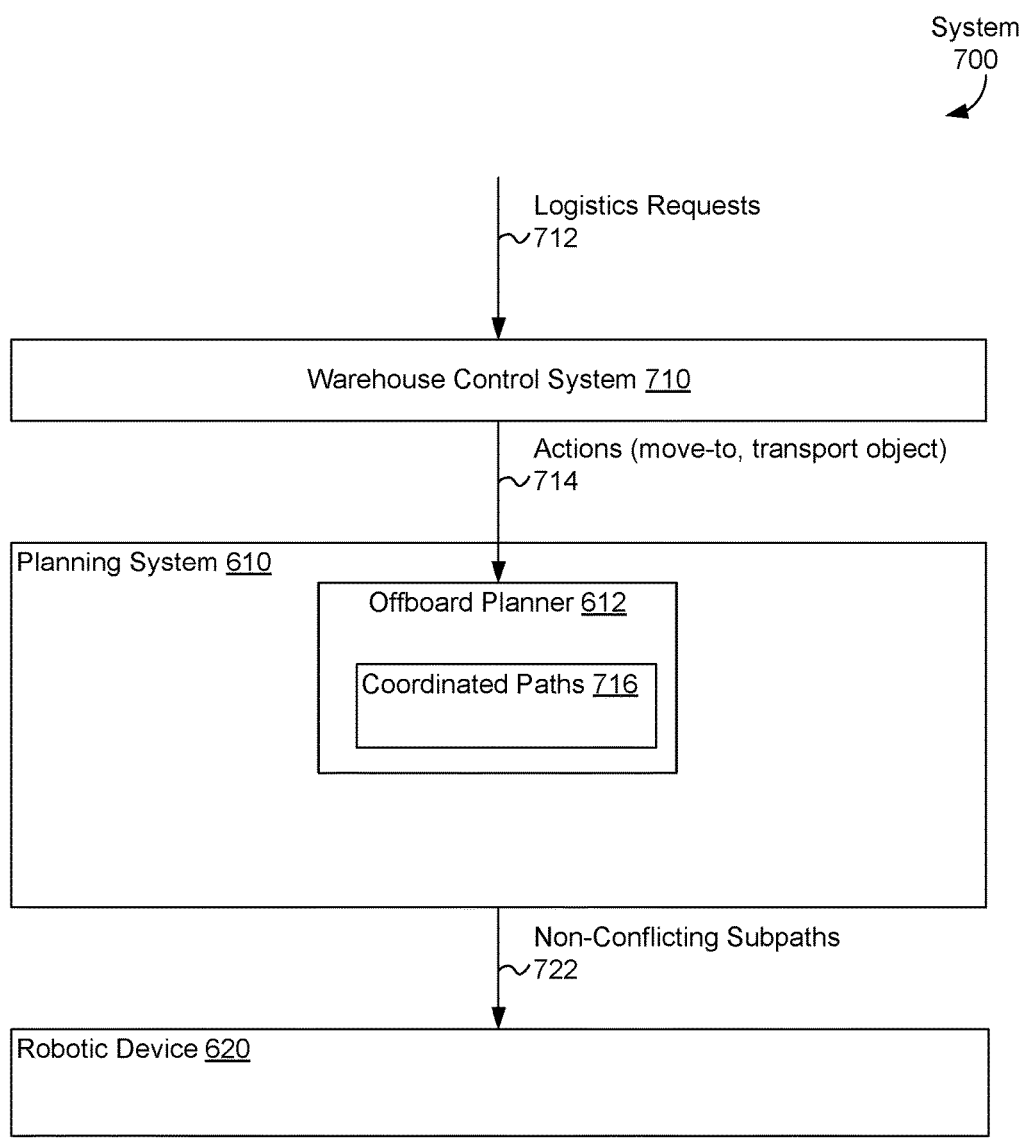
FIG. 7 depicts a system for operating one or more warehouses, in accordance with an example embodiment.

FIG. 7 depicts system 700 for operating one or more warehouses, in accordance with an example embodiment. System 700 includes warehouse management system 710, planning system 610, and robotic device 620. Warehouse management system 710 can receive one or more logistics requests 712 associated with the warehouse; e.g., requests to store one or more items in the warehouse and/or requests to ship one or more items from the warehouse. Warehouse management system 710 can translate logistics requests 712 into one or more actions 714, where actions 714 can include, but are not limited to, a "move-to" action to move one or more designated agents to one or more designated locations, and a "transport" action to carry one or more items to one or more designated locations. In some examples, actions 714 can be go-to commands of the form {agent ID, destination}, but other actions are possible such as "move pallet". These are typically decomposable into move-to commands, however (move to pick location, move to place location).

Planning system 610 includes offboard planner 612. Offboard planner 612 can receive actions 714 as inputs and generate one or more coordinated paths 716 for one or more agents operating in a warehouse; e.g., multiple robotic devices, to carry out actions 714. Coordinated paths 716 can be part of a coordinated action plan for all agents in the warehouse to fulfill logistics requests 712. The coordinated action plan can take precedence of agents into account; e.g., if robotic devices RD1 and RD2 are both expected to reach a point at approximately the same time, one of the robotic devices can have precedence or priority over the other, such as robotic device RD1 waiting for robotic device RD2 to pass through the point (or vice versa). Planning system 610 can receive coordinated paths 716 and generate non-conflicting sub-paths 722 to direct robotic device 620 in accomplishing its part of the coordinated action plan to carry out actions 714 to fulfill logistics requests 712.

In some examples, offboard planner 612 can act as a multi-agent planner and generate a coordinated action plan for the one or more agents operating in the warehouse. In these examples, offboard planner 612 can determine a coordinated action plan that includes at least a route for each of the one or more agents, and can assign each agent with a monotonically increasing priority value; e.g., an amount of time the agent has spent on its route. Also, offboard planner 612 can determine a coordinated action plan based on a roadmap that includes one or more lanes. Then, by using the roadmap that includes one or more lanes and by determining routes for agents having monotonically increasing priority values, offboard planner 612 can determine a coordinated action plan that avoid deadlocks among the one or more agents.

As illustrated above in FIG. 7, planning system 610, which includes offboard planner 612, can communicate with robotic device 620. In some embodiments, the robotic device can be a fork truck, such as, for example, any Occupational Safety and Health Administration (OSHA) Class 1 or Class 3 powered industrial truck. In other embodiments, planning system 610 can include software that executes using one or more networked computing devices located in the "cloud" (e.g., one or more networked computing devices) and/or located somewhere on a premises co-located with robotic device 620.

Figure 8:
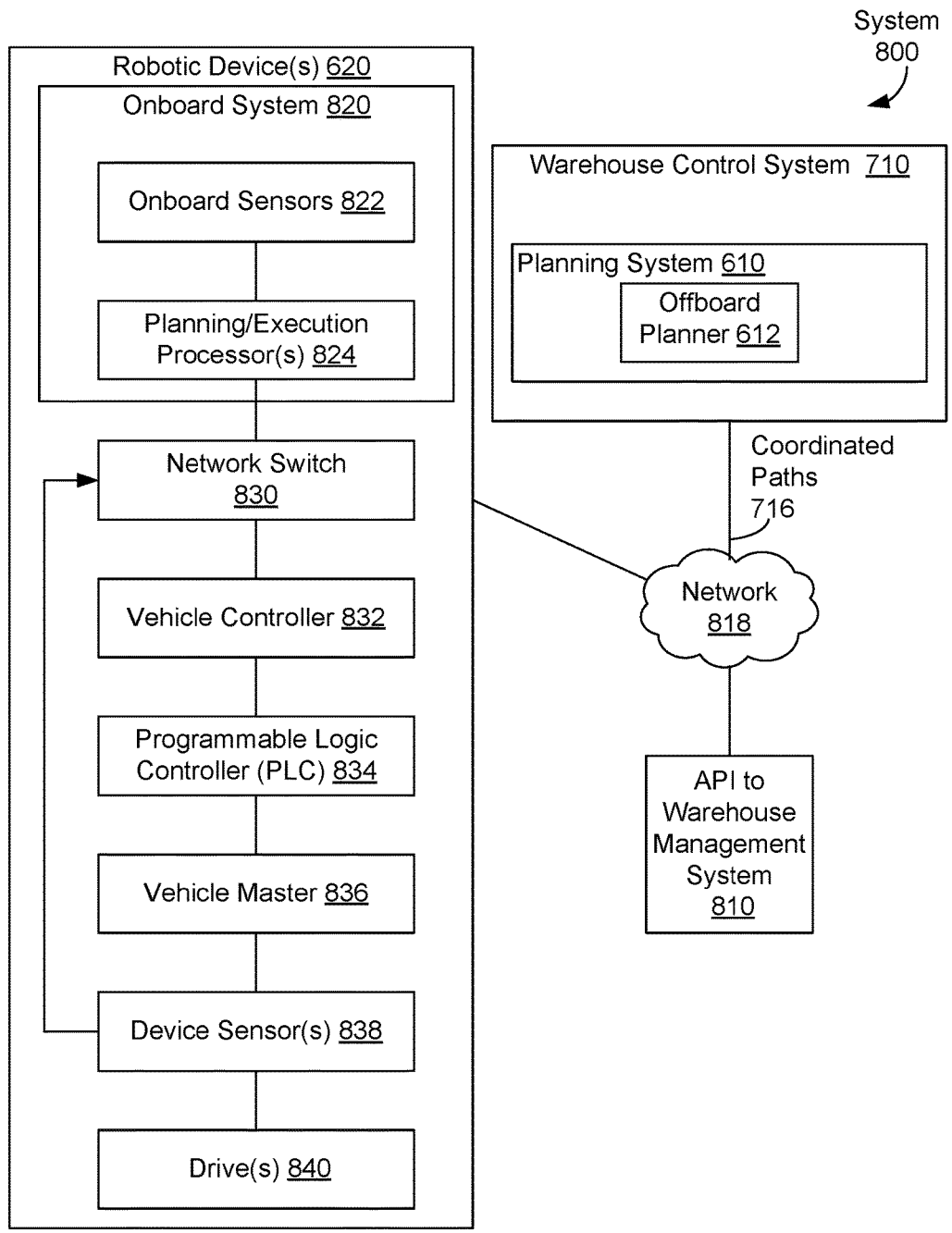
FIG. 8 illustrates a system, in accordance with an example embodiment.

FIG. 8 illustrates a system 800 that includes API to Warehouse Management System 810, Warehouse Control System 710, and one or more robotic devices 620 connected using network 818, in accordance with an example embodiment. API to Warehouse Management System 810 can provide inventory task instructions to Warehouse Control System 710 via network 818 regarding movement of objects, such as pallets, and/or robotic devices to Warehouse Control system 710. An example inventory task can be to bring pallet A containing items of type B to location C.

Warehouse Control System 710 can receive the inventory task instructions from API to Warehouse Management System 810 and generate one or more task/mission instructions (e.g., an instruction to robotic device A to move pallet B from location C to location D) and/or plans for controlling robotic device(s) 620 to carry out the inventory task instructions. The task/mission instructions and/or plans can include information about one or more paths and/or one or more trajectories, where the task/mission instruction(s), plan(s), path(s) and trajectory/trajectories are generated by planning system 610 of Warehouse Control System 710 using the techniques discussed in the context of FIGS. 6 and 7.

For example, Warehouse Control System 710 can be a centralized control service running on and storing data using one or more computing devices; e.g., server computing devices. To perform these tasks, Warehouse Control System 710 can include WMS middleware and can provide a user interface to provide access to tools for monitoring and managing system 800. The WMS middleware and/or other components of Warehouse Control System 710 can use one or more application programming interfaces (APIs), such as protocol conversion APIs for conversion between task/mission instructions (e.g., an instruction to robotic device A to move pallet B from location C to location D) to robotic device paths, poses, and/or trajectories; conversion between inventory tasks and task/mission instructions; and conversions between APIs.

The user interface provided by Warehouse Control System 710 can provide one or more user interface functions for system 800, including, but not limited to: monitoring of robotic device(s) 620, e.g, presenting data related to location, battery status, state of charge, etc. of one or more robotic devices; enabling generation and sending of inventory task instruction(s), task/mission instruction(s), plan(s), path(s) and/or trajectory/trajectories to one or more of robotic device(s) 620; and reviewing, updating, deletion, and/or insertion of data related to one or more warehouse maps, pallets, networks, and/or planning systems (e.g., planning system 610, Warehouse Control System 710, and/or API to Warehouse Management System 810).

In some embodiments, Warehouse Control System 710 can route communications between API to Warehouse Management System 810 and robotic device(s) 620 and between two or more of robotic device(s) 620 and manage one or more onboard systems, such as onboard system 820 aboard one or more of robotic device(s) 620. In other embodiments, Warehouse Control System 710 can store, generate, read, write, update, and/or delete data related to system 800, such as, but not limited to: data regarding completion of a task/mission instruction by one or more of robotic device(s) 620; data regarding locations and/or poses of some or all of robotic device(s) 620, including data indicating a location where a robotic device was initialized/booted; data related to one or more audit trails for human actions, incident analysis, and/or debugging; and data for state tracking. In other embodiments, Warehouse Control System 710 can include a central message router/persistence manager that communicates with robotic device(s) 620 and one or more adapters. Each of the one or more adapters can provide access to data and/or communications of system 800 available to Warehouse Control System 710, and can include, but are not limited, to: a user interface service adapter for the above-mentioned user interface, a web content service adapter enabling World Wide Web (WWW)/Internet access to information about system 800, a message proxy adapter and/or a WMS adapter to act as intermediaries between communications between APIs and/or the WMS.

In still other embodiments, planning system 610 and/or Warehouse Control System 710 can include some or all of the functionality of a roadmap editor.

FIG. 8 shows that each of the one or more robotic devices 620 can include one or more of: onboard system 820, network switch 830, vehicle controller 832, programmable logic controller (PLC) 834, vehicle master 836, one or more device sensors 838, and one or more drives 840.

Onboard system 820 can be a computation and sensor package for robotic planning configured for installation into and use with robotic device 620, where onboard system 820 can include onboard sensors 822 and one or more planning/execution processors 824. FIG. 8 also shows that onboard system 820 that is configured to use network switch 830 at least to communicate with planning system 610 (via network 818), with device sensors 838, and/or with one or more actuators of robotic device 620.

Onboard system 820 can be responsible for one or more of: localization of robotic device 620, generation of local trajectories to carry out plans and/or travel along paths and/or trajectories provided by Warehouse Control System 710, generation of commands to drives 840 to follow one or more (local) trajectories, generation of commands to control actuator(s) of robotic device 620, and reporting pose, status and/or other information to Warehouse Control System 710.

Onboard sensors 822 can include one or more navigation lasers, laser scanners, cameras, and/or other sensors for navigating and/or controlling onboard system 820. For example, a robotic device of robotic device(s) 620 can include one or more laser scanners, such as one or more laser scanners provided by SICK AG of Waldkirch, Germany, HOKUYO AUTOMATIC CO. LTD of Osaka, Japan, and/or KEYENCE CORPORATION of Osaka, Japan. The laser scanners can be used for obstacle detection and/or avoidance along a direction of travel of the robotic device as well as along the sides, corners, and/or back of the robotic device. The laser scanners can also be used to localize the robotic device using reflector-based localization. In some embodiments, cameras and/or other sensors can be used for obstacle detection, obstacle avoidance, and/or localization instead of or along with the laser scanners.

Planning/execution processor(s) 824 can include one or more computer processors connected at least to onboard sensors 822. Planning/execution processor(s) 824 can read data from onboard sensors 822, generate local trajectories and/or commands to drive(s) 840 to move robotic device 620, and communicate with Warehouse Control System 710. A local trajectory can be a trajectory where robotic device 620 starts at a starting pose and reaches an ending pose at some time. In some examples, the starting pose can be implicitly specified; e.g., the starting pose can be a current pose of robotic device 620 and so the local trajectory be based on an assumption that its starting pose is the current pose of robotic device 620.

The component framework can include one or more of: a state machine component, a localization component, a planning component, and a trajectory following component. The state machine component can manage a state of robotic device 620 for vehicle initialization, vehicle commanding and fault handling. The state machine component can use a deterministic finite automaton or other state machine to manage the state of the robotic device.

The localization component can read data from vehicle sensors and integrate prior state information of robotic device 620 to determine a pose of robotic device 620. The vehicle sensor data may be indicative of one or more landmarks/points of interest detected by the vehicle sensors. Alternatively, the data from the vehicle sensors may require processing such that the localization component detects the one or more landmarks/points of interest based on the vehicle sensor data. The pose can be determined relative to the one or more detected landmarks/points of interest, such as pallets or other objects. The planning component can receive one or more objectives from Warehouse Control System 710 and determine a local trajectory for robotic device 620 to achieve those objectives. In some embodiments, the local trajectory can be a short-term trajectory that robotic device 620 is to follow for a predetermined amount of time; e.g., 100 milliseconds, 200 milliseconds, 500 milliseconds, 1 second, 5 seconds. The trajectory following component can receive the local trajectory generated by the planning component, and generate drive control instructions to travel along the local trajectory. The drive control instructions that are then relayed to drives 840 that control a traction motor and other actuators for robotic device 620.

Network switch 830 can enable communications for robotic device(s) 620. These communications can include, but are not limited to, communications between onboard system 820 and the rest of robotic device 620; e.g, device sensors 838 and drives 840, and communications with Warehouse Control System 710 via network 818. For example, network switch 830 can enable Transmission Control Protocol/Internet Protocol (TCP/IP)-based communications over Ethernet and/or other wireline communications interface(s) to a wireline network and/or over Wi-Fi™ and/or other wireless communications interface(s) to a wireless network, such as a PLANET Ethernet Switch by PLANET Technology Corporation of New Taipei City, Taiwan.

In some embodiments, communications between robotic device(s) 620 and planning system 610 can include remote procedure calls (RPCs). The remote procedure calls can allow invocation of software procedures, methods, and/or functions resident on one or more of robotic device(s) 620 by software of planning system 610 and vice versa. The remote procedure calls can be based on a communications protocol, such as TCP/IP, a HyperText Transfer Protocol (HTTP) such as HTTP 1.0 and/or HTTP 2.0, and/or another communications protocol. Some or all of the remote procedure calls can include encrypted data; such data may be encrypted using the Secure Sockets Layer (SSL), Transport Layer Security (TLS), and/or one or more other encryption algorithms and/or protocols. In embodiments where encrypted data is used, one or more certification authorities, such as a private certification authority, can authenticate one or more certificates used in encrypting and/or decrypting the encrypted data. A certificate authority can use an access control list (ACL) to control access to the one or more certificates. The remote procedure calls can use a request/response protocol and/or a bidirectional streaming protocol for RPC-related communications. In embodiments where the bidirectional streaming protocol is used for RPC-related communications, a single long-lived RPC can be used to implement the bidirectional streaming protocol.

Vehicle controller 832 and/or programmable logic controller 834 can provide electrical and sensor management functionality for robotic device(s) 620. The electrical and sensor management functionality can include, but is not limited to, functionality for electrical load control, lighting control, sensor control, sensor and/or switch signal processing, and power management. Vehicle master 836 can provide functionality for controlling one or more actuators, such as lift devices, of robotic device(s) 620.

Device sensor(s) 838 can include one or more sensors that can provide data related to controlling and/or operating robotic device(s) 620. The data can provide information about an environment about robotic device(s) 620, such as but not limited to, localization information, position estimates, and mapping data. For example, device sensor(s) 838 can include one or more lasers (e.g., two-dimensional (2D) lasers, safety lasers, and laser scanners), cameras (e.g., Time-of-Flight (ToF) cameras, Red-Green-Blue (RGB) cameras, thermal cameras), electrical sensors, proximity sensors, navigational devices, and location sensors.

Drive(s) 840 can include one or more drive controllers and/or actuators that provide functionality for moving robotic device(s) 620. The drive controllers can direct the drive actuators to control movement of robotic device(s) 620. The drive actuators can include one or more traction motors, electric drives, hydraulic drives, and pneumatic drives.

Figure 9:
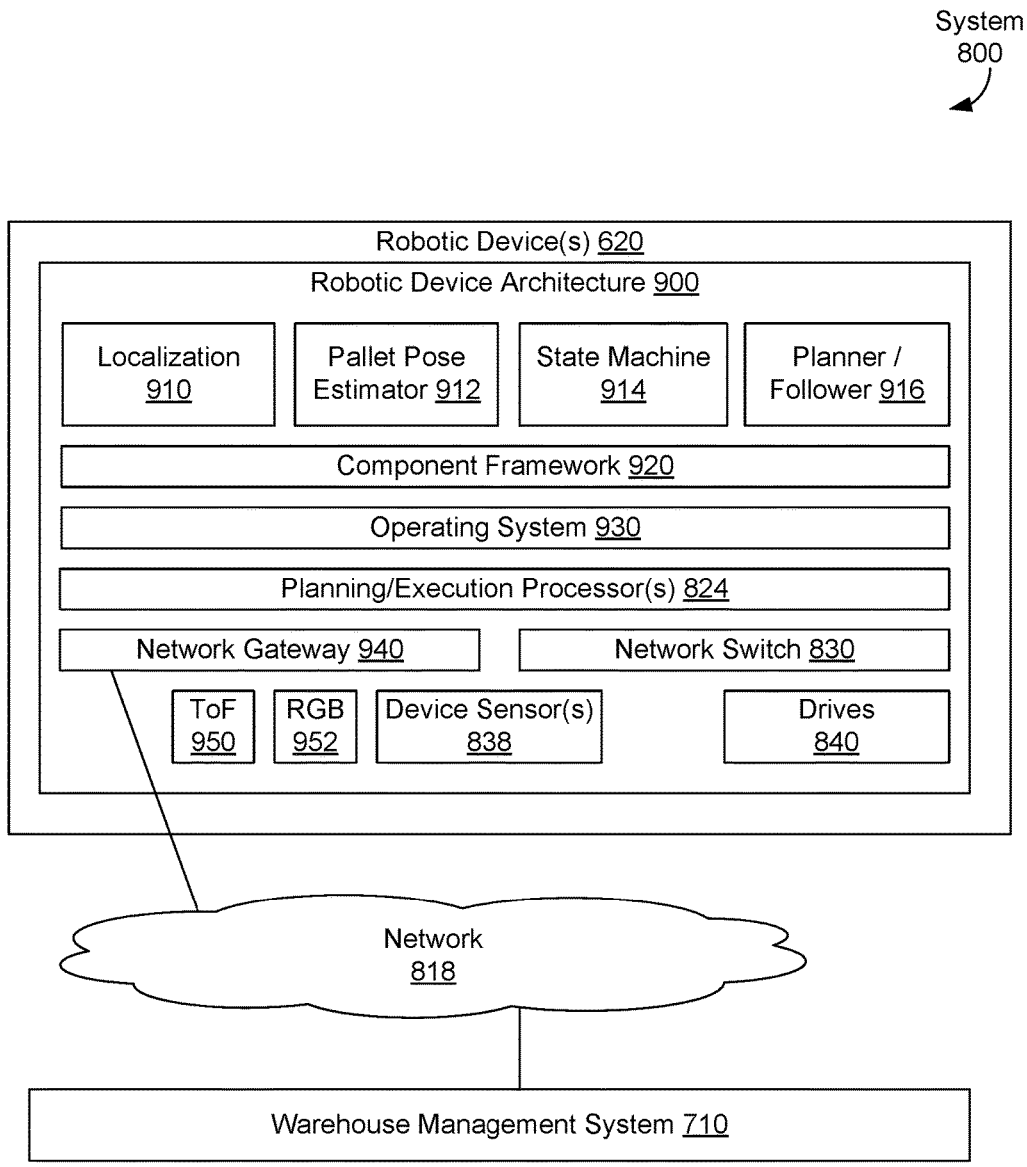
FIG. 9 illustrates a robotic device architecture for one or more robotic devices, in accordance with an example embodiment.

FIG. 9 illustrates robotic device architecture 900 of robotic device(s) 620, in accordance with an example embodiment. Robotic device architecture 900 of robotic device(s) 620 can include software. The software can include software for localization 910, software for a pallet pose estimator 912, software related to state machine 914, software for planner follower 916, software for component framework 920 and software for operating system 930. The software can be executed by one or more hardware planning/execution processors 824. Communications between robotic device(s) 620 and other devices can be carried out using network gateway 940 and/or network switch 830. For example, network gateway 940 can be used for wireless communications with and within a robotic device of robotic device(s) 620 and network switch 830 can be used for wireline communications with and within a robotic device of robotic device(s) 620. Robotic device architecture 900 also includes additional hardware such as device sensor(s) 838 and drive(s) 840 discussed above in the context of FIG. 8. In some embodiments, robotic device architecture 900 can include one or more cameras, including but not limited to, ToF camera 950 and RGB camera 952, where the one or more cameras can include one or more still cameras and/or one or more video cameras.

Computing Device Architecture

Figure 10A:
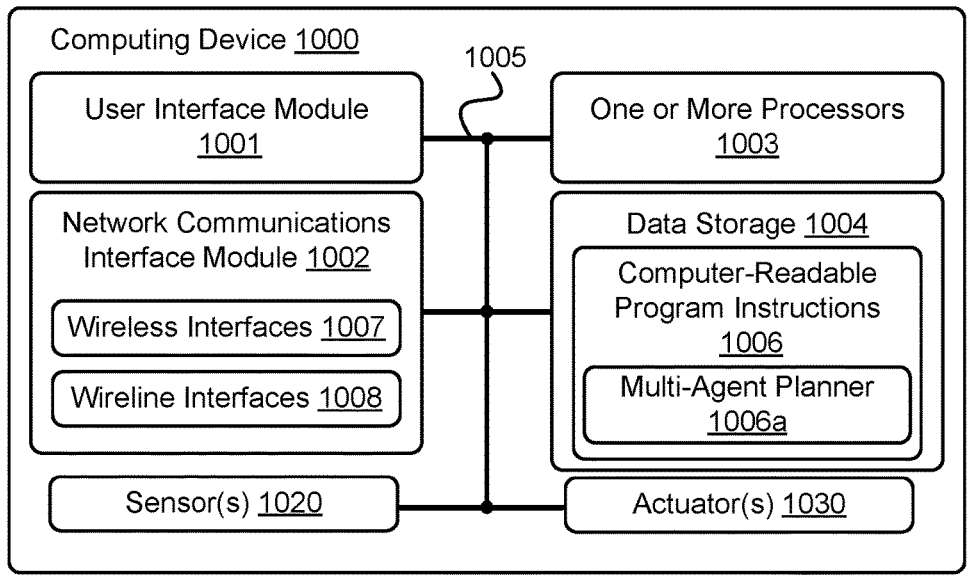
FIG. 10A is a functional block diagram of an example computing device, in accordance with an example embodiment.

FIG. 10A is a functional block diagram of an example computing device 1000, in accordance with an example embodiment. In particular, computing device 1000 shown in FIG. 10A can be configured to perform at least one function of a herein-described multi-agent planner, software for a roadmap generator 101, computing device 103, system 800, API to Warehouse Management System 810, network 818, 1014, onboard system 820, network switch 830, vehicle controller 832, programmable logic controller 834, vehicle master 836, device sensor(s) 838, drive(s) 840, robotic device architecture 900, and/or at least one function related to roadmaps 400 and 500, and scenario 101. Computing device 1000 may include a user interface module 1001, a network-communication interface module 1002, one or more processors 1003, data storage 1004, one or more sensors 1020, and one or more actuators 1030, all of which may be linked together via a system bus, network, or other connection mechanism 1005. In some embodiments, computing device 1000 can be configured to act as part or all of a multi-agent planner.

User interface module 1001 can be operable to send data to and/or receive data from external user input/output devices. For example, user interface module 1001 can be configured to send and/or receive data to and/or from user input devices such as a keyboard, a keypad, a touch screen, a computer mouse, a track ball, a joystick, a camera, a voice recognition module, and/or other similar devices. User interface module 1001 can also be configured to provide output to user display devices, such as one or more cathode ray tubes (CRT), liquid crystal displays, light emitting diodes (LEDs), displays using digital light processing (DLP) technology, printers, light bulbs, and/or other similar devices, either now known or later developed. User interface module 1001 can also be configured to generate audible output(s), such as a speaker, speaker jack, audio output port, audio output device, earphones, and/or other similar devices.

Network-communications interface module 1002 can include one or more wireless interfaces 1007 and/or one or more wireline interfaces 1008 that are configurable to communicate via a network. Wireless interfaces 1007 can include one or more wireless transmitters, receivers, and/or transceivers, such as a Bluetooth transceiver, a Zigbee transceiver, a Wi-Fi transceiver, a WiMAX transceiver, and/or other similar type of wireless transceiver configurable to communicate via a wireless network. Wireline interfaces 1008 can include one or more wireline transmitters, receivers, and/or transceivers, such as an Ethernet transceiver, a Universal Serial Bus (USB) transceiver, or similar transceiver configurable to communicate via a twisted pair wire, a coaxial cable, a fiber-optic link, or a similar physical connection to a wireline network.

In some embodiments, network communications interface module 1002 can be configured to provide reliable, secured, and/or authenticated communications. For each communication described herein, information for ensuring reliable communications (i.e., guaranteed message delivery) can be provided, perhaps as part of a message header and/or footer (e.g., packet/message sequencing information, encapsulation header(s) and/or footer(s), size/time information, and transmission verification information such as CRC and/or parity check values). Communications can be made secure (e.g., be encoded or encrypted) and/or decrypted/decoded using one or more cryptographic protocols and/or algorithms, such as, but not limited to, DES, AES, RSA, Diffie-Hellman, and/or DSA. Other cryptographic protocols and/or algorithms can be used as well or in addition to those listed herein to secure (and then decrypt/decode) communications.

Processors 1003 can include one or more general purpose processors, and/or one or more special purpose processors (e.g., digital signal processors, graphics processing units, application specific integrated circuits, etc.). Processors 1003 can be configured to execute computer-readable program instructions 1006 that are contained in the data storage 1004 and/or other instructions as described herein. In some embodiments, computer-readable program instructions 1006 can include instructions for multi-agent planner 1006a, which can carry out some or all of the functionality of a herein-described multi-agent planner Data storage 1004 can include one or more computer-readable storage media that can be read and/or accessed by at least one of processors 1003. The one or more computer-readable storage media can include volatile and/or non-volatile storage components, such as optical, magnetic, organic or other memory or disc storage, which can be integrated in whole or in part with at least one of processors 1003. In some embodiments, data storage 1004 can be implemented using a single physical device (e.g., one optical, magnetic, organic or other memory or disc storage unit), while in other embodiments, data storage 1004 can be implemented using two or more physical devices.

Data storage 1004 can include computer-readable program instructions 1006 and perhaps additional data. In some embodiments, data storage 1004 can additionally include storage required to perform at least part of the herein-described methods and techniques and/or at least part of the functionality of the devices and networks.

In some embodiments, computing device 1000 can include one or more sensors 1020. Sensor(s) 1020 can be configured to measure conditions in an environment for computing device 1000 and provide data about that environment; e.g., an environment represented by a herein-described roadmap. For example, sensor(s) 1020 can include one or more of: (i) an identification sensor to identify other objects and/or devices, such as, but not limited to, an RFID reader, proximity sensor, one-dimensional barcode reader, two-dimensional barcode (e.g., Quick Response (QR) code) reader, and a laser tracker, where the identification sensor(s) can be configured to read identifiers, such as RFID tags, barcodes, QR codes, and/or other devices and/or object configured to be read and provide at least identifying information; (ii) a location sensor to measure locations and/or movements of the computing device 1000, such as, but not limited to, a gyroscope, an accelerometer, a Doppler sensor, a Global Positioning System (GPS) device, a sonar sensor, a radar device, a laser-displacement sensor, and a compass; (iii) an environmental sensor to obtain data indicative of an environment of computing device 1000, such as, but not limited to, an infrared sensor, an optical sensor, a light sensor, a camera, a biosensor, a capacitive sensor, a touch sensor, a temperature sensor, a wireless sensor, a radio sensor, a movement sensor, a microphone, a sound sensor, an ultrasound sensor, and/or a smoke sensor; and (iv) a force sensor to measure one or more forces (e.g., inertial forces and/or G-forces) acting about the computing device 1000, such as, but not limited to one or more sensors that measure: forces in one or more dimensions, torque, ground force, friction, and/or a zero moment point (ZMP) sensor that identifies ZMPs and/or locations of the ZMPs. Many other examples of sensor(s) 1020 are possible as well.

Cloud-Based Servers

Figure 10B:
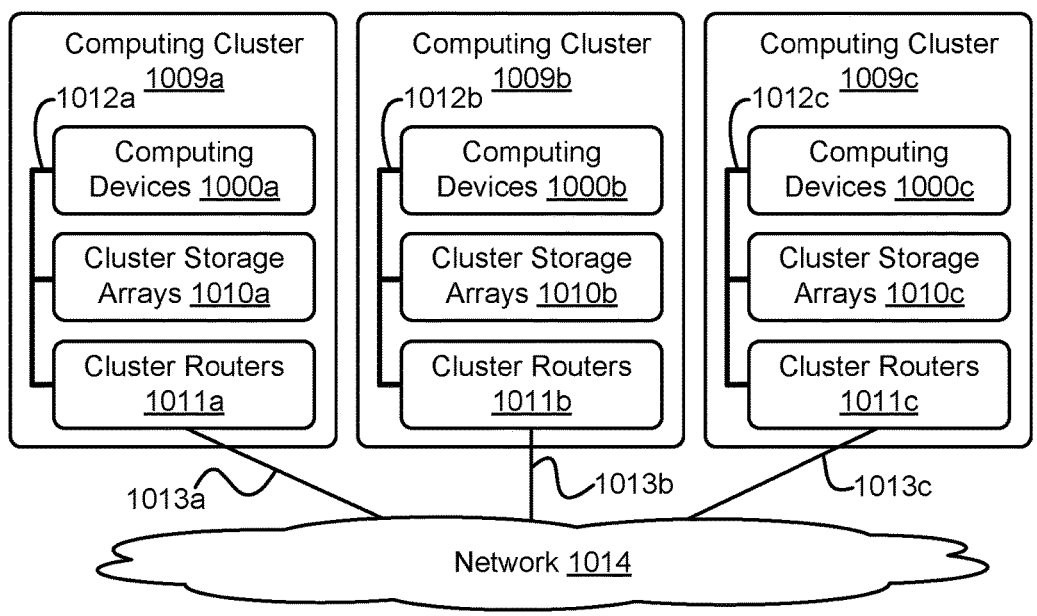
FIG. 10B depicts a network of computing clusters arranged as a cloud-based server system, in accordance with an example embodiment.

FIG. 10B depicts a network 1014 of computing clusters 1009a, 1009b, 1009c arranged as a cloud-based server system in accordance with an example embodiment. Computing clusters 1009a, 1009b, 1009c can be cloud-based devices that store program logic and/or data of cloud-based applications and/or services; e.g., perform at least one function of a herein-described multi-agent planner, software for a multi-agent planner, computing device 103, roadmap generator 101, system 800, API to Warehouse Management System 810, network 818, 1014, onboard system 820, network switch 830, vehicle controller 832, programmable logic controller 834, vehicle master 836, device sensor(s) 838, drive(s) 840, robotic device architecture 900, and/or at least one function related to roadmaps 400 and 500, and scenario 101.

In some embodiments, computing clusters 1009a, 1009b, 1009c can be a single computing device residing in a single computing center. In other embodiments, computing clusters 1009a, 1009b, 1009c can include multiple computing devices in a single computing center, or even multiple computing devices located in multiple computing centers located in diverse geographic locations. For example, FIG. 10B depicts each of computing clusters 1009a, 1009b, 1009c residing in different physical locations.

In some embodiments, data and services at computing clusters 1009a, 1009b, 1009c can be encoded as computer readable information stored in non-transitory, tangible computer readable media (or computer readable storage media) and accessible by other computing devices. In some embodiments, computing clusters 1009a, 1009b, 1009c can be stored on a single disk drive or other tangible storage media, or can be implemented on multiple disk drives or other tangible storage media located at one or more diverse geographic locations.

FIG. 10B depicts a cloud-based server system in accordance with an example embodiment. In FIG. 10B, functionality of a safety system can be distributed among three computing clusters 1009a, 1009b, and 1009c. Computing cluster 1009a can include one or more computing devices 1000a, cluster storage arrays 1010a, and cluster routers 1011a connected by a local cluster network 1012a. Similarly, computing cluster 1009b can include one or more computing devices 1000b, cluster storage arrays 1010b, and cluster routers 1011b connected by a local cluster network 1012b. Likewise, computing cluster 1009c can include one or more computing devices 1000c, cluster storage arrays 1010c, and cluster routers 1011c connected by a local cluster network 1012c.

In some embodiments, each of the computing clusters 1009a, 1009b, and 1009c can have an equal number of computing devices, an equal number of cluster storage arrays, and an equal number of cluster routers. In other embodiments, however, each computing cluster can have different numbers of computing devices, different numbers of cluster storage arrays, and different numbers of cluster routers. The number of computing devices, cluster storage arrays, and cluster routers in each computing cluster can depend on the computing task or tasks assigned to each computing cluster.

In computing cluster 1009a, for example, computing devices 1000a can be configured to perform various computing tasks of a multi-agent planner, a robot, a roadmap editor, and/or a computing device. In one embodiment, the various functionalities of a multi-agent planner, a robot, a roadmap editor, and/or a computing device can be distributed among one or more computing devices 1000a, 1000b, and 1000c. Computing devices 1000b and 1000c in respective computing clusters 1009b and 1009c can be configured similarly to computing devices 1000a in computing cluster 1009a. On the other hand, in some embodiments, computing devices 1000a, 1000b, and 1000c can be configured to perform different functions.

In some embodiments, computing tasks and stored data associated with a multi-agent planner, a robot, a roadmap editor, and/or a computing device can be distributed across computing devices 1000a, 1000b, and 1000c based at least in part on the processing requirements of a multi-agent planner, a robot, a roadmap editor, and/or a computing device, the processing capabilities of computing devices 1000a, 1000b, and 1000c, the latency of the network links between the computing devices in each computing cluster and between the computing clusters themselves, and/or other factors that can contribute to the cost, speed, fault-tolerance, resiliency, efficiency, and/or other design goals of the overall system architecture.

The cluster storage arrays 1010a, 1010b, and 1010c of the computing clusters 1009a, 1009b, and 1009c can be data storage arrays that include disk array controllers configured to manage read and write access to groups of hard disk drives. The disk array controllers, alone or in conjunction with their respective computing devices, can also be configured to manage backup or redundant copies of the data stored in the cluster storage arrays to protect against disk drive or other cluster storage array failures and/or network failures that prevent one or more computing devices from accessing one or more cluster storage arrays.

Similar to the manner in which the functions of a multi-agent planner, a robot, a roadmap editor, and/or a computing device can be distributed across computing devices 1000a, 1000b, and 1000c of computing clusters 1009a, 1009b, and 1009c, various active portions and/or backup portions of these components can be distributed across cluster storage arrays 1010a, 1010b, and 1010c. For example, some cluster storage arrays can be configured to store one portion of the data of a multi-agent planner, a robot, a roadmap editor, and/or a computing device, while other cluster storage arrays can store other portion(s) of data of a multi-agent planner, a robot, a roadmap editor, and/or a computing device. Additionally, some cluster storage arrays can be configured to store backup versions of data stored in other cluster storage arrays.

The cluster routers 1011a, 1011b, and 1011c in computing clusters 1009a, 1009b, and 1009c can include networking equipment configured to provide internal and external communications for the computing clusters. For example, the cluster routers 1011a in computing cluster 1009a can include one or more internet switching and routing devices configured to provide (i) local area network communications between the computing devices 1000a and the cluster storage arrays 1010a via the local cluster network 1012a, and (ii) wide area network communications between the computing cluster 1009a and the computing clusters 1009b and 1009c via the wide area network connection 1013a to network 1014. Cluster routers 1011b and 1011c can include network equipment similar to the cluster routers 1011a, and cluster routers 1011b and 101 c can perform similar networking functions for computing clusters 1009b and 1009b that cluster routers 1011a perform for computing cluster 1009a.

In some embodiments, the configuration of the cluster routers 1011a, 1011b, and 1011c can be based at least in part on the data communication requirements of the computing devices and cluster storage arrays, the data communications capabilities of the network equipment in the cluster routers 1011a, 101 b, and 101c, the latency and throughput of local networks 1012a, 1012b, 1012c, the latency, throughput, and cost of wide area network links 1013a, 1013b, and 1013c, and/or other factors that can contribute to the cost, speed, fault-tolerance, resiliency, efficiency and/or other design criteria of the moderation system architecture.

Example Methods of Operation

Figure 11:
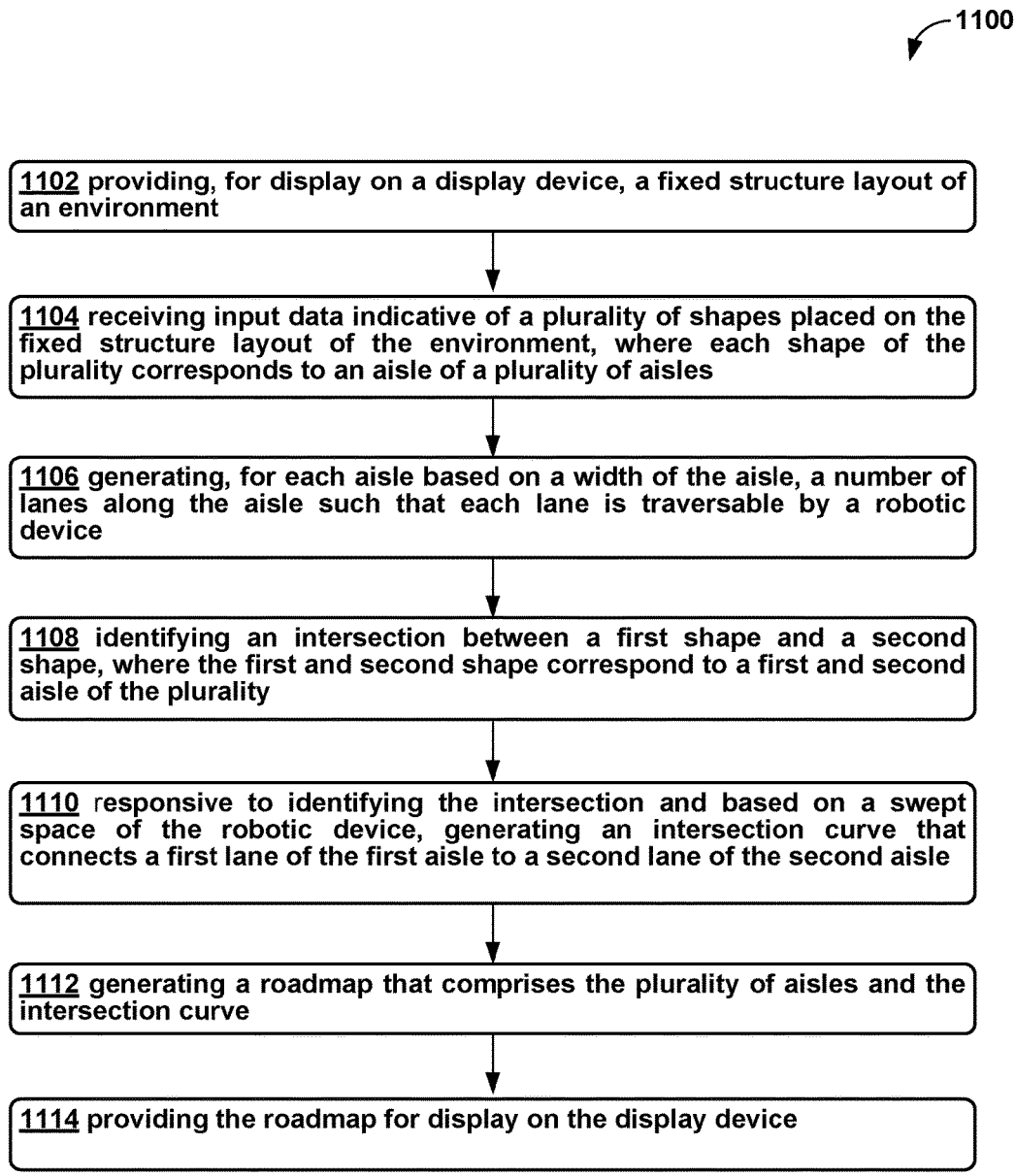
FIG. 11 is a flowchart of a method, in accordance with an example embodiment.

FIG. 11 is a flowchart of method 1100, in accordance with an example embodiment. Method 1100 can be carried out by a computing device, such as computing device 1000. In particular, computing device 1000 can execute software embodying a herein-described multi-agent planner to carry out method 1100.

Method 1100 can begin at block 1102, where the method involves providing, for display on a display device, a fixed structure layout of an environment, such as discussed above in the context of at least FIGS. 1A-1D. The display may take on any form and may be arranged to project images and/or graphics to a user of the controller. For example, the display may include: an opaque or a transparent (or semi-transparent) matrix display, such as an electroluminescent display or a liquid crystal display, one or more waveguides for delivering an image to the user's eyes, or other optical elements capable of delivering an image to the user.

At block 1104, the method further involves receiving input data indicative of a plurality of shapes placed on the fixed structure layout of the environment, where each shape of the plurality corresponds to an aisle of a plurality of aisles, such as discussed above in the context of at least FIGS. 1A-1D. The input data may be generated in response to any input (e.g., input by a user via a graphical interface). In particular, the input data may be received via input/output unit. The input/output unit may allow for interaction with the graphical interface such as for scrolling, providing text, and/or selecting various features of the application, among other possible interactions. The input/output unit may take on various forms. In one example, the input/output unit may include a pointing device such as a computing mouse used for control of the graphical interface. However, if the computing device 103 includes a touch screen display, touch-input can be received (e.g., such as using a finger or a stylus) that allows for control of the graphical interface. In another example, the input/output unit may include a keyboard that provides for selection of numbers, characters and/or symbols to be displayed via the graphical interface. For instance, in the arrangement where the computing device 103 includes a touch screen display, portions the display may show the keyboard. Thus, touch-input on the portion of the display including the keyboard may result in user-input such as selection of specific numbers, characters, and/or symbols to be shown on the graphical interface through the display. In yet another example, the input/output unit may include a voice input device that receives audio input, such as from a user through a microphone, that is then interpretable using one of various speech recognition techniques into one or more characters that may be shown through the display. Other examples may also be possible.

At block 1106, the method further involves generating, for each aisle based on a width of the aisle, a number of lanes along the aisle such that each lane is traversable by a robotic device, such as discussed above in the context of at least FIGS. 2A and 2B.

At block 1108, the method further involves identifying an intersection between a first shape and a second shape, where the first and second shape correspond to a first and second aisle of the plurality, such as discussed above at least in the context of FIGS. 2B and 3A-3G.

At block 1110, the method further involves responsive to identifying the intersection and based on a swept space of the robotic device, generating an intersection curve that connects a first lane of the first aisle to a second lane of the second aisle, such as discussed above in the context of at least FIGS. 2B and 3A-3G.

At block 1112, the method further involves generating a roadmap that comprises the plurality of aisles and the intersection curve, such as discussed above in the context of at least FIGS. 2B, 3A-3G and 4.

At block 1114, the method further involves providing the roadmap for display on the display device, such as discussed above in the context of at least FIG. 4.

The present disclosure is not to be limited in terms of the particular embodiments described in this application, which are intended as illustrations of various aspects. Some of the herein-disclosed techniques are described in terms of operations involving robots, but those herein-disclosed techniques are applicable to agents in general unless explicitly stated otherwise. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The above detailed description describes various features and functions of the disclosed systems, devices, and methods with reference to the accompanying figures. In the figures, similar symbols typically identify similar components, unless context dictates otherwise. The illustrative embodiments described in the detailed description, figures, and claims are not meant to be limiting. Other embodiments can be utilized, and other changes can be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

With respect to any or all of the ladder diagrams, scenarios, and flow charts in the figures and as discussed herein, each block and/or communication may represent a processing of information and/or a transmission of information in accordance with example embodiments. Alternative embodiments are included within the scope of these example embodiments. In these alternative embodiments, for example, functions described as blocks, transmissions, communications, requests, responses, and/or messages may be executed out of order from that shown or discussed, including substantially concurrent or in reverse order, depending on the functionality involved. Further, more or fewer blocks and/or functions may be used with any of the ladder diagrams, scenarios, and flow charts discussed herein, and these ladder diagrams, scenarios, and flow charts may be combined with one another, in part or in whole.

A block that represents a processing of information may correspond to circuitry that can be configured to perform the specific logical functions of a herein-described method or technique. Alternatively or additionally, a block that represents a processing of information may correspond to a module, a segment, or a portion of program code (including related data). The program code may include one or more instructions executable by a processor for implementing specific logical functions or actions in the method or technique. The program code and/or related data may be stored on any type of computer readable medium such as a storage device including a disk or hard drive or other storage medium.

The computer readable medium may also include non-transitory computer readable media such as non-transitory computer-readable media that stores data for short periods of time like register memory, processor cache, and random access memory (RAM). The computer readable media may also include non-transitory computer readable media that stores program code and/or data for longer periods of time, such as secondary or persistent long term storage, like read only memory (ROM), optical or magnetic disks, compact-disc read only memory (CD-ROM), for example. The computer readable media may also be any other volatile or non-volatile storage systems. A computer readable medium may be considered a computer readable storage medium, for example, or a tangible storage device.

Moreover, a block that represents one or more information transmissions may correspond to information transmissions between software and/or hardware modules in the same physical device. However, other information transmissions may be between software modules and/or hardware modules in different physical devices.

While various aspects and embodiments have been disclosed herein, other aspects and embodiments will be apparent to those skilled in the art. The various aspects and embodiments disclosed herein are for provided for explanatory purposes and are not intended to be limiting, with the true scope being indicated by the following claims.

The invention claimed is:

1. A method comprising:
   providing, for display on a display device, a fixed structure layout of an environment;
   receiving input data indicative of a plurality of shapes placed on the fixed structure layout of the environment, wherein each shape of the plurality corresponds to an aisle of a plurality of aisles;
   generating, for each aisle based on a width of the aisle, a number of lanes along the aisle, wherein each lane is traversable by a robotic device;
   identifying an intersection between a first shape and a second shape, wherein the first and second shape correspond to a first and second aisle of the plurality;
   responsive to identifying the intersection, selecting, from a plurality of predetermined intersection curve templates that correspond to different combinations of numbers of lanes within each aisle, an intersection curve template to connect a first lane of the first aisle to a second lane of the second aisle;
   based on a swept space of the robotic device and a non-traversable area associated with each fixed structure, adjusting a curvature of the intersection curve template;
   generating a roadmap that comprises the plurality of aisles and the adjusted intersection curve template; and
   providing the roadmap for display on the display device.

2. The method of claim 1, wherein the layout is a two-dimensional (2D) computer-aided drawing (CAD) of the environment.

3. The method of claim 1, wherein each shape is placed over a substantially vacant area in the fixed structure layout, and the method further comprises:
   based on the input data, fitting each shape into the substantially vacant area such that the shape does not overlap any fixed structures in the fixed structure layout.

4. The method of claim 1, wherein each shape is placed over a substantially vacant area in the fixed structure layout, and the method further comprises:
   based on the input data, fitting each shape into the substantially vacant area such that the shape fills any vacant area extending from the substantially vacant area.

5. The method of claim 1, wherein, for each aisle, the number of lanes extend along the aisle up to a threshold distance from each end of the aisle.

6. The method of claim 1, wherein the number of lanes in each aisle is further based on one or more of: the swept space of the robotic device, a predetermined minimum distance between any two lanes, and a non-traversable area associated with each fixed structure.

7. The method of claim 1, further comprising positioning the number of lanes in the aisle based on one or more of: the width of the aisle, a predetermined minimum distance between any two lanes, and a non-traversable area associated with each fixed structure.

8. The method of claim 1, further comprising:
   generating, for each fixed structure of a particular type, a secondary aisle that leads from the fixed structure to a proximal lane of the plurality of lanes.

9. The method of claim 1, wherein the intersection comprises a first intersection point between (i) a first segment of the first lane, and (ii) a second segment of the second lane, and wherein the intersection curve connects the first segment of the first lane and the second segment of the second lane.

10. The method of claim 9, wherein the intersection further comprises a second intersection point between (i) a third segment of another lane of the first aisle, and (ii) a fourth segment of another lane of the second aisle, wherein the intersection curve is a first intersection curve, and the method further comprises:
   generating a second intersection curve that connects the third segment and the fourth segment.

11. The method of claim 10, wherein the first and third segments are parallel, and wherein the first and second intersection curves are oriented different from each other.

12. The method of claim 1, wherein the first lane and the second lane are perpendicular and non-intersecting lanes.

13. The method of claim 1, wherein the intersection curve is a track transition curve.

14. The method of claim 1, wherein a curvature of the intersection curve is based on one or more of: a turning radius of a robotic device, a maximum speed of the robotic device, and a maximum acceleration of a robotic device.

15. The method of claim 1, further comprising:
based on the roadmap, generating a path for the robotic device to traverse the environment.

16. The method of claim 1, wherein selecting, from a plurality of predetermined intersection curve templates that correspond to different combinations of numbers of lanes within each aisle, an intersection curve template is further based on whether the intersecting lanes are unidirectional or bidirectional.

17. The method of claim 1, wherein the plurality of predetermined intersection curve templates includes at least: (i) a template corresponding to two lanes in each aisle, (ii) a template corresponding to one lane in each aisle, and (iii) a template corresponding to one lane in the first aisle and a two lanes in the second aisle.

18. A computing device, comprising:
a display device;
one or more processors; and
a control system configured to:
provide, for display on a display device, a fixed structure layout of an environment;
receive input data indicative of a plurality of shapes placed on the layout of the environment, wherein each shape corresponds to an aisle of a plurality of aisles;
generate, for each aisle based on a width of the aisle, a number of lanes along the aisle such that each lane is traversable by a robotic device;
identify an intersection between a first shape and a second shape, wherein the first and second shape correspond to a first and second aisle of the plurality;
responsive to identifying the intersection select, from a plurality of predetermined intersection curve templates corresponding to different combinations of numbers of lanes within each aisle, an intersection curve template to connect a first lane of the first aisle to a second lane of the second aisle;
based on a swept space of the robotic device and a non-traversable area associated with each fixed structure, adjust a curvature of the intersection curve template;
generate a roadmap that comprises the plurality of aisles and the adjusted intersection curve template; and
provide the roadmap for display on the display device.

19. The computing device of claim 18, wherein each shape is placed over a respective substantially vacant area in the fixed structure layout, and wherein the control system is further configured to:
based on the input data, fit each shape into the substantially vacant area such that: (i) the shape does not overlap any fixed structures in the fixed structure layout, and (ii) the shape fills any vacant area extending from the respective substantially vacant area.

20. A non-transitory computer readable medium having stored thereon instructions, that when executed by one or more processors of a computing device, cause the computing device to perform functions comprising:
providing, for display on a display device, a fixed structure layout of an environment;
receiving input data indicative of a plurality of shapes placed on the layout of the environment, wherein each shape corresponds to an aisle of a plurality of aisles;
generating, for each aisle based on a width of the aisle, a number of lanes along the aisle such that each lane is traversable by a robotic device;
identifying an intersection between a first shape and a second shape, wherein the first and second shape correspond to a first and second aisle of the plurality;
responsive to identifying the intersection based on a number of lanes in the first and second aisle, selecting, from a plurality of predetermined intersection curve templates that correspond to different combinations of numbers of lanes within each aisle, an intersection curve template to connect a first lane of the first aisle to a second lane of the second aisle;
based on a swept space of the robotic device and a non-traversable area associated with each fixed structure, adjusting a curvature of the intersection curve template;
generating a roadmap that comprises the plurality of aisles and the adjusted intersection curve template; and
providing the roadmap for display on the display device.

* * * * *